(12) United States Patent
Nishido

(10) Patent No.: US 9,105,869 B2
(45) Date of Patent: Aug. 11, 2015

(54) LIGHT-EMITTING DEVICE AND MANUFACTURING METHOD THEREOF

(71) Applicant: SEMICONDUCTOR ENERGY LABORATORY CO., LTD., Atsugi-shi, Kanagawa-ken (JP)

(72) Inventor: Yusuke Nishido, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/546,157

(22) Filed: Nov. 18, 2014

(65) Prior Publication Data

US 2015/0069449 A1 Mar. 12, 2015

Related U.S. Application Data

(62) Division of application No. 13/888,630, filed on May 7, 2013, now Pat. No. 8,926,389.

(30) Foreign Application Priority Data

May 11, 2012 (JP) ................. 2012-109603

(51) Int. Cl.
*H01L 51/50* (2006.01)
*H01L 51/52* (2006.01)
*H05B 33/04* (2006.01)
*H01L 51/00* (2006.01)
*H01L 27/32* (2006.01)

(52) U.S. Cl.
CPC .......... *H01L 51/524* (2013.01); *H01L 27/3251* (2013.01); *H01L 51/0097* (2013.01); *H01L 51/5246* (2013.01); *H05B 33/04* (2013.01); *H01L 51/5243* (2013.01); *H01L 2251/5315* (2013.01); *H01L 2251/5338* (2013.01)

(58) Field of Classification Search
CPC ...... H01L 51/5237–51/525; H01L 2251/5338; H01L 2251/5323; H01L 2251/56; H05B 33/04
USPC .................................. 313/500–512
See application file for complete search history.

(56) References Cited

U.S. PATENT DOCUMENTS 7,568,961 B2 8/2009 Kim
8,367,440 B2 2/2013 Takayama et al.
(Continued)

FOREIGN PATENT DOCUMENTS

JP 2003-174153 A 6/2003
JP 2011-065895 A 3/2011

*Primary Examiner* — Mariceli Santiago
(74) *Attorney, Agent, or Firm* — Nixon Peabody LLP; Jeffrey L. Costellia

(57) ABSTRACT

A light-emitting device which is thin and lightweight and has high flexibility, impact resistance, and reliability is provided. Further, a light-emitting device which is thin and lightweight and has high flexibility, impact resistance, and hermeticity is provided. In the light-emitting device in which a light-emitting region including a transistor and a light-emitting element is sealed between a first flexible substrate and a second flexible substrate, an opening is provided in the second flexible substrate around a region overlapping with the light-emitting region, the opening is filled with frit glass containing low-melting glass and bonding the first flexible substrate and the second flexible substrate, and the fit glass is provided so as to be in contact with an insulating layer provided over the first flexible substrate. The second flexible substrate may include an opening in a region overlapping with the light-emitting region.

7 Claims, 16 Drawing Sheets

(56) References Cited

U.S. PATENT DOCUMENTS

| | | |
|---|---|---|
| 8,415,208 B2 | 4/2013 | Takayama et al. |
| 8,710,732 B2 | 4/2014 | Roberts et al. |
| 2006/0087224 A1 | 4/2006 | Oki et al. |
| 2010/0301743 A1 | 12/2010 | Kodama et al. |
| 2011/0199348 A1* | 8/2011 | Takatani et al. ............. 445/24 |
| 2012/0074838 A1 | 3/2012 | Im et al. |
| 2012/0261713 A1* | 10/2012 | Koo et al. ................. 257/40 |
| 2013/0048967 A1 | 2/2013 | Nishido et al. |

* cited by examiner

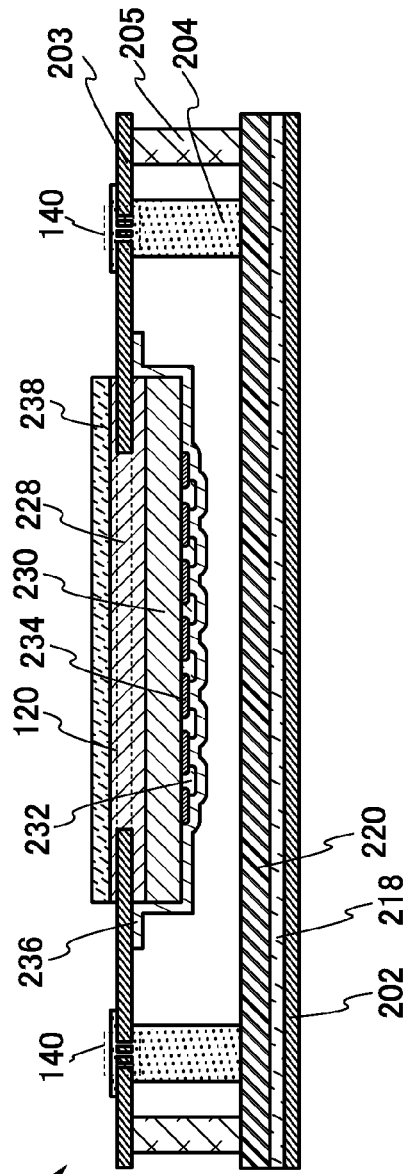
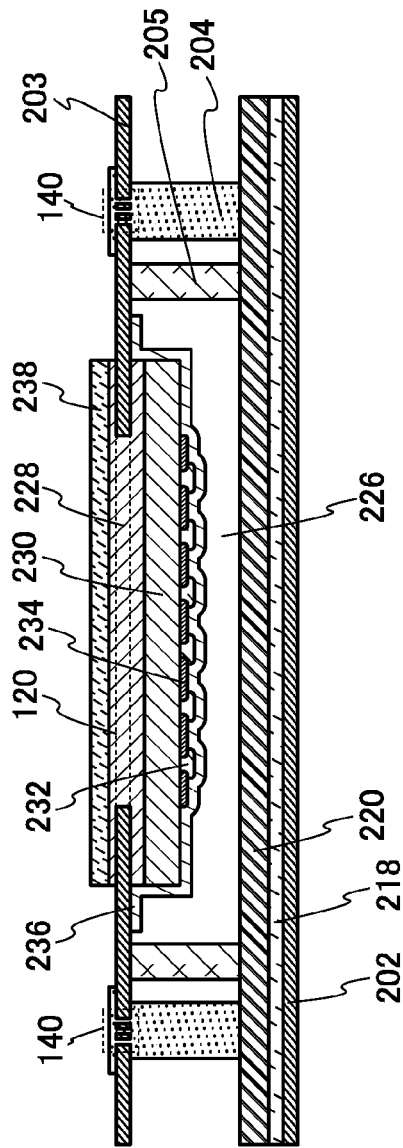
FIG. 4A
FIG. 4B

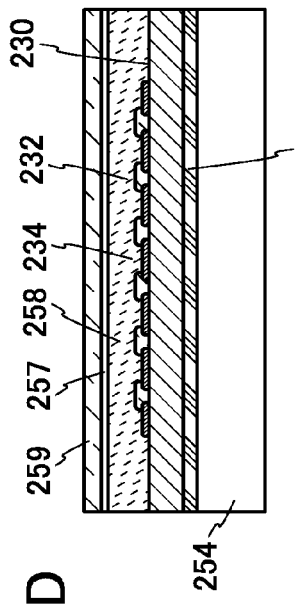
FIG. 6A
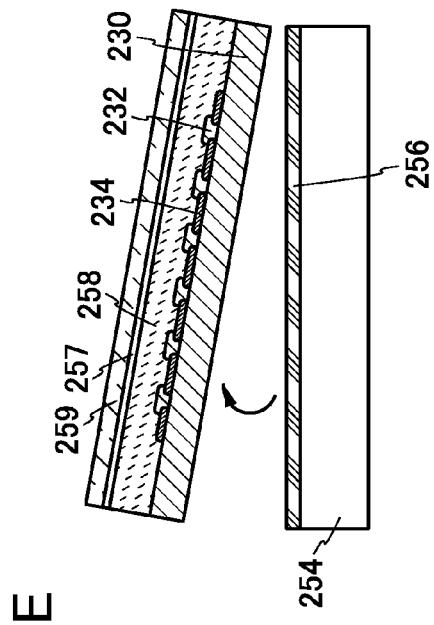
FIG. 6B
FIG. 6C
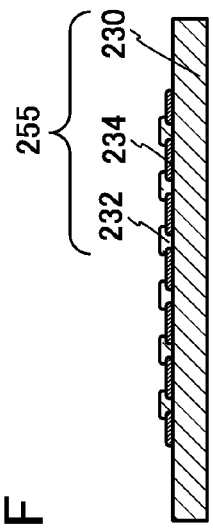
FIG. 6D
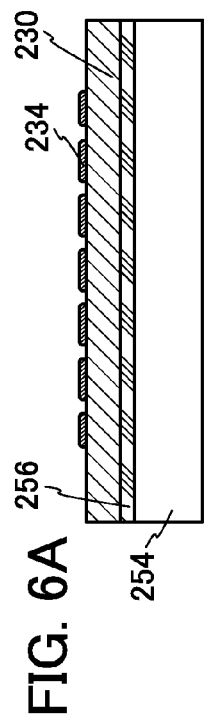
FIG. 6E
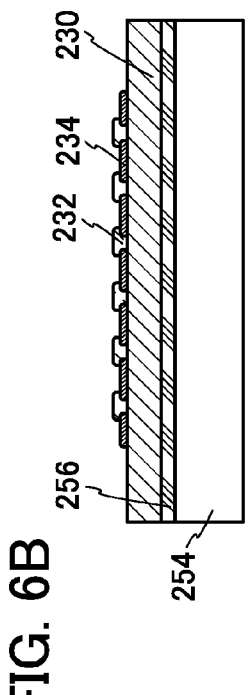
FIG. 6F
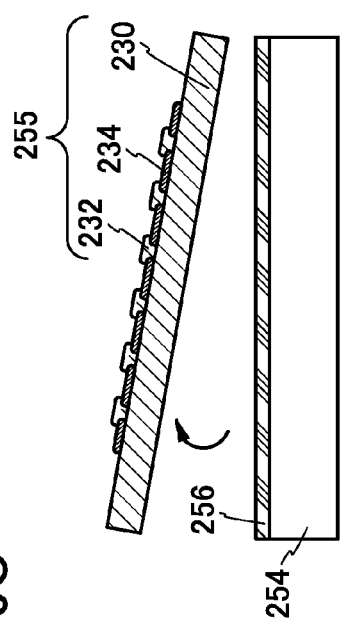

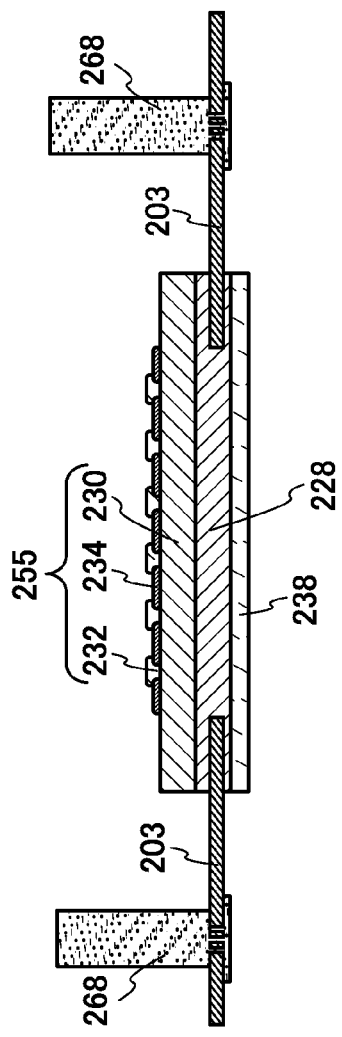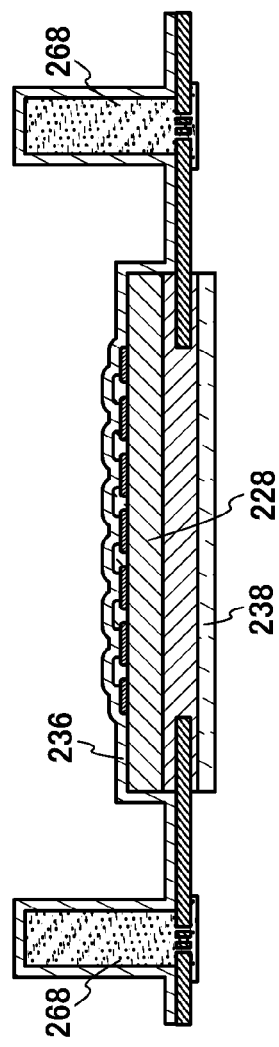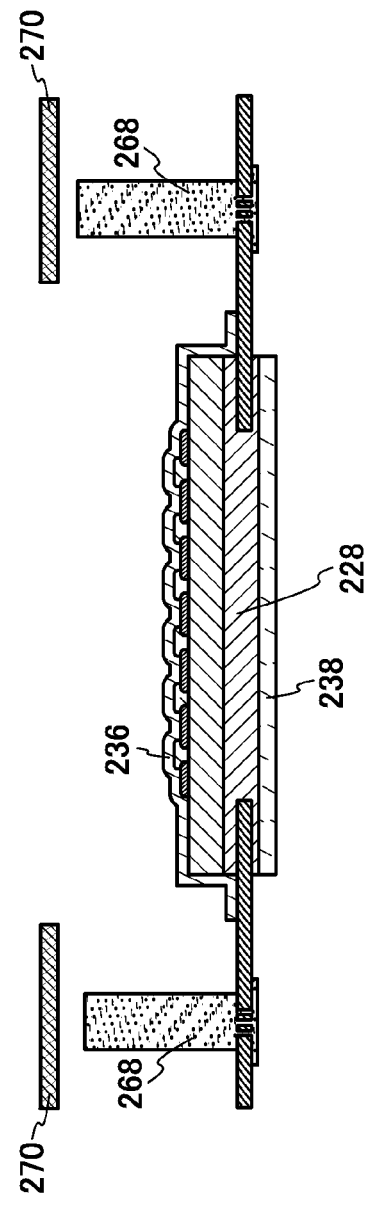

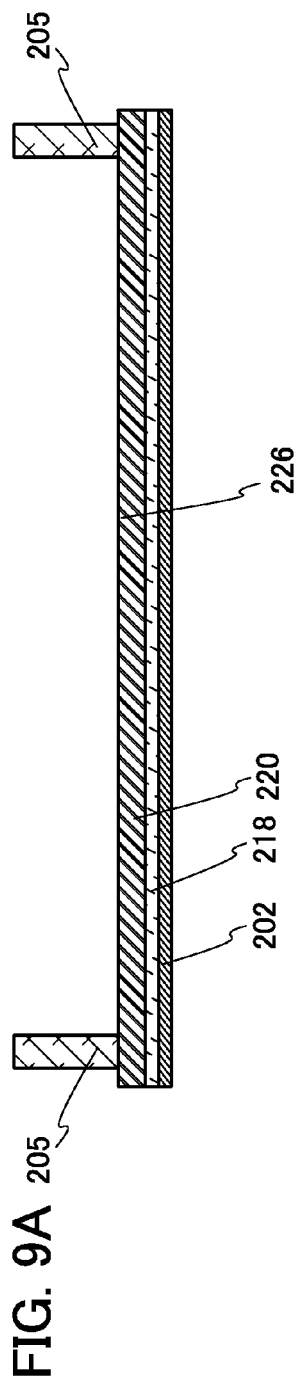
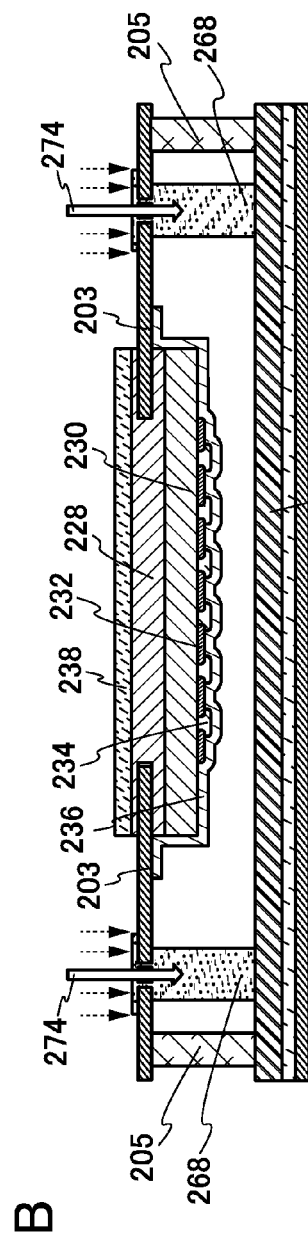
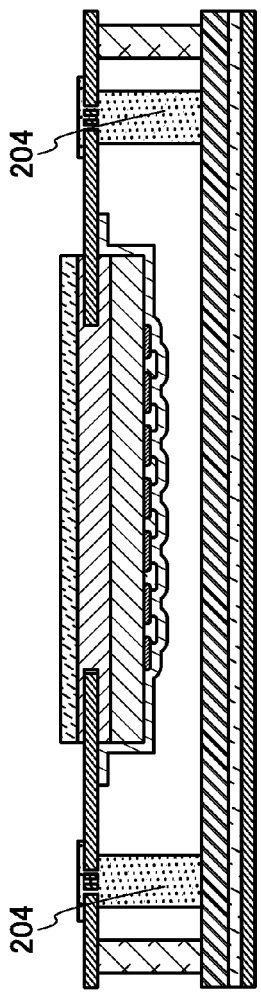

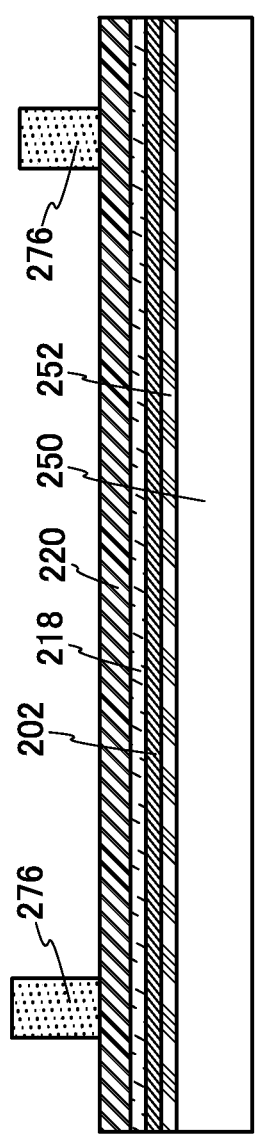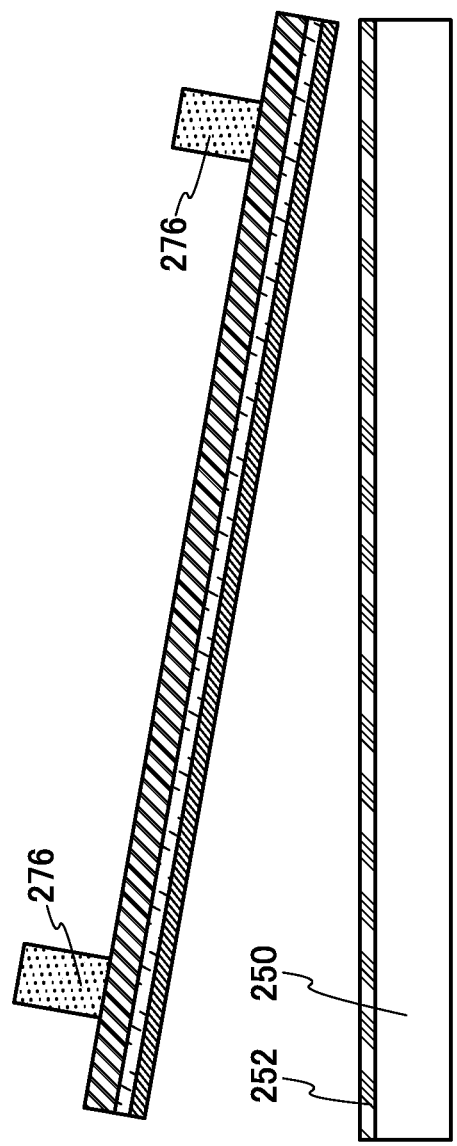
FIG. 10A
FIG. 10B

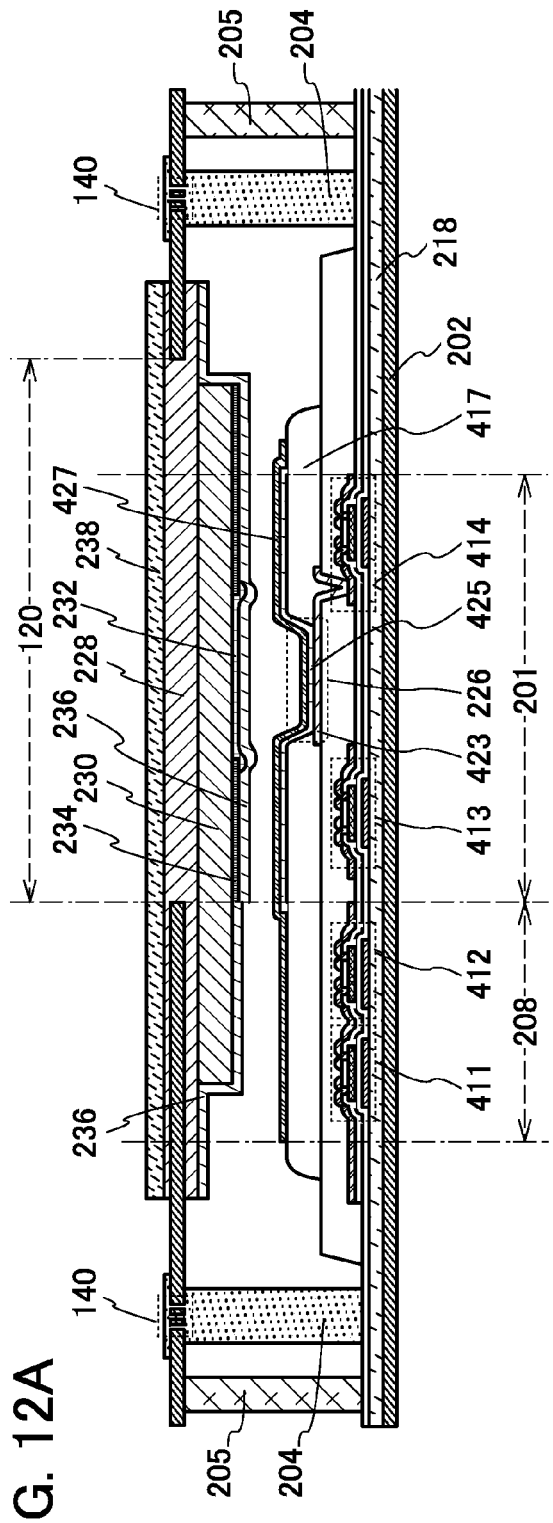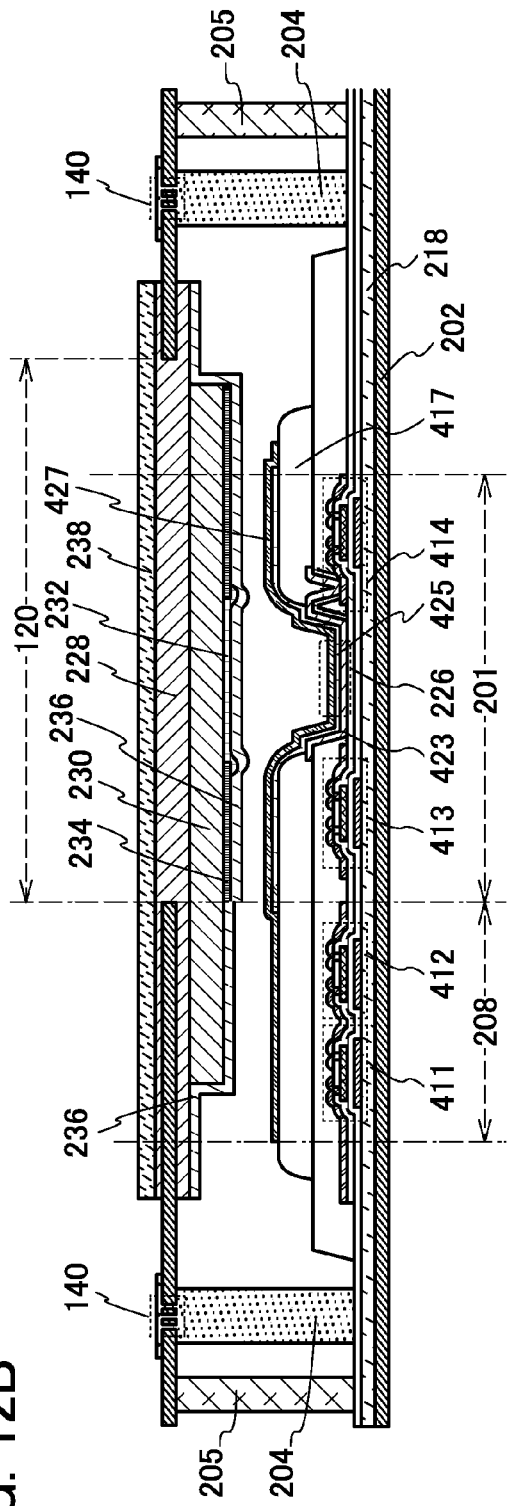

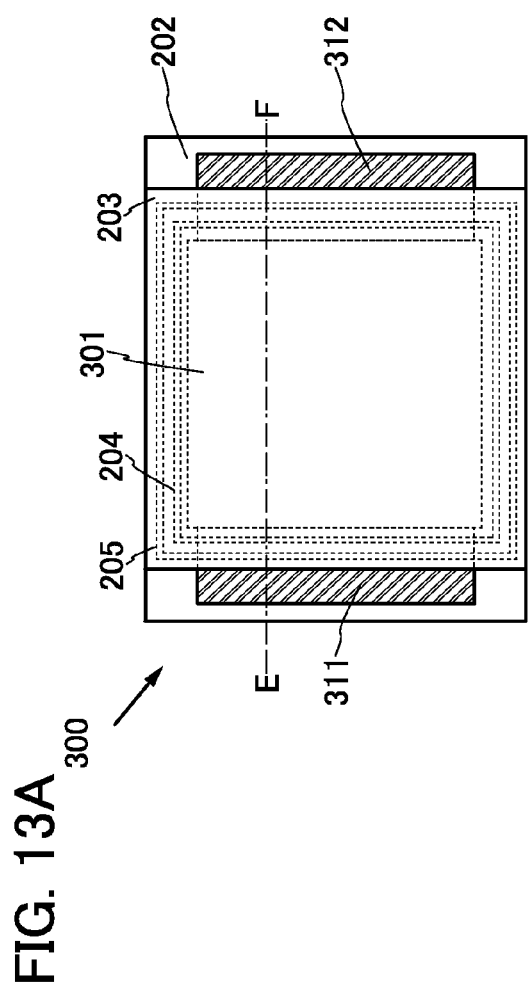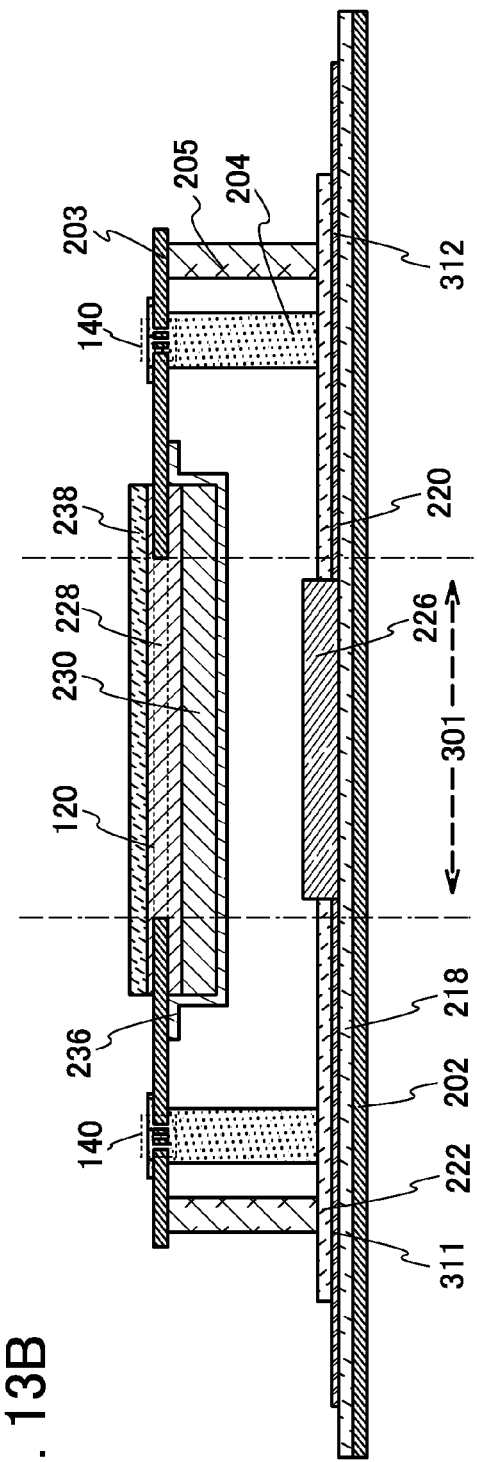

LIGHT-EMITTING DEVICE AND MANUFACTURING METHOD THEREOF

BACKGROUND OF THE INVENTION

1. Field of the Invention

One embodiment of the present invention relates to a light-emitting device utilizing electroluminescence. Further, one embodiment of the present invention relates to an electronic device using the light-emitting device.

2. Description of the Related Art

In recent years, research and development have been extensively conducted on light-emitting elements using electroluminescence (EL). In a basic structure of such a light-emitting element, a layer containing a light-emitting substance is interposed between a pair of electrodes. By applying a voltage to the element, light emission can be obtained from the light-emitting substance.

Since the light-emitting element is a self-luminous type, a light-emitting device using this light-emitting element has advantages such as high visibility, no necessity of a backlight, low power consumption, and the like. Further, such a light-emitting element also has advantages in that the element can be formed to be thin and lightweight and that response time is high.

In order to improve flexibility and impact resistance in addition to its thinness and lightness, a flexible substrate has been proposed to be used in a light-emitting device including the light-emitting element. The flexible substrate is applied not only to the light-emitting device but also to a semiconductor device or the like which functions by utilizing semiconductor characteristics.

As a method for manufacturing semiconductor device using a flexible substrate, a technique in which after a semiconductor element such as a thin film transistor is formed over a base material such as a glass substrate or a quartz substrate, the semiconductor element is transferred from the base material to another base material (e.g., a flexible substrate) has been developed. In order to transfer the semiconductor element to another base material, a step for separating the semiconductor element from the base material that is used in manufacturing the semiconductor element is necessary.

In addition, Patent Document 1 discloses a technique in which separation is conducted by physical force such as human hands. In Patent Document 1, a metal layer is formed between a substrate and an oxide layer and separation is generated at the interface between the oxide layer and the metal layer by utilizing weak bonding at the interface between the oxide layer and the metal layer, so that a layer to be separated and the substrate are separated from each other.

In Patent Document 1, an intermediate insulating layer is formed over the light-emitting element including an anode, an organic light-emitting layer, and a cathode, and the intermediate insulating layer is bonded to a supporting member using an adhesive layer (a bonding layer). Then, separation is performed at the interface between the oxide layer and the metal layer, and the layer to be separated which includes the light-emitting element is attached onto a film substrate using the adhesive layer, whereby a light-emitting device including a flexible substrate is manufactured.

A technique in which a highly airtight sealed structure is formed in such a manner that two substrates are bonded to each other by a glass layer containing low-melting frit glass is known. In a technique disclosed in Patent Document 2, a paste containing a binder and a low-melting glass frit material is applied to a glass substrate along the edge of the glass substrate, the binder is removed and the frit material is melted to form frit glass by baking of the paste, and the frit glass is irradiated with laser light with the substrate overlapping with a counter substrate so that the substrate and the counter substrate are bonded to each other with the frit glass provided therebetween; thus, a highly airtight sealed body is formed.

Such frit glass has a high gas barrier property; thus, the sealed space can be kept away from the external atmosphere. A method of sealing using such frit glass is applied to a device including an element (e.g., an organic EL (electroluminescent) element) whose performance is rapidly impaired once the element is exposed to air (including moisture or oxygen).

REFERENCE

Patent Document

[Patent Document 1] Japanese Published Patent Application No. 2003-174153

[Patent Document 2] Japanese Published Patent Application No. 2011-65895

SUMMARY OF THE INVENTION

A sealing method using frit glass capable of forming a sealed structure with high hermeticity includes a process of heating a substrate to a high temperature.

For example, baking is necessary for removing a binder after a paste (hereinafter also referred to as a frit paste) which contains a frit material containing low-melting glass and the binder is applied to the substrate. Although baking temperature depends on the material, baking at a high temperature of approximately 200° C. to 400° C. generally needs to be performed for removing the binder.

When the binder is sufficiently removed by baking at such a high temperature, the frit glass after being irradiated with laser light can have a high gas barrier property. When the baking of the frit paste is insufficient, the binder or the like might remain in the frit glass which has been irradiated with the laser light, resulting in low hermeticity, or a crack might be generated in the frit glass to break the sealing. Thus, it is important to bake the frit paste at such a high temperature.

In addition, the softening point of general low-melting glass is from 300° C. to 600° C. In order to bond the substrates with the frit glass containing low-melting glass, the substrate may be heated over a temperature at which the binder can be removed. In general, the upper temperature limit of a light-transmitting flexible substrate formed of an organic resin is approximately 200° C. or lower. Thus, it is difficult to use such a sealing method using frit glass as a method for forming a sealed body.

Further, the flexible substrate formed of an organic resin transmits atmospheric components (including water and oxygen) more than a little; thus, in the case where the flexible substrate formed of an organic resin is used for a device including an organic EL element, it is said that the device has a problem in its reliability.

In view of the above, an object of one embodiment of the present invention is to provide a light-emitting device which is thin and lightweight and has high flexibility, impact resistance, and reliability. Another object of one embodiment of the present invention is to provide a light-emitting device which is thin and lightweight and has high flexibility, impact resistance, and hermeticity.

One embodiment of the present invention is a light-emitting device including a first flexible substrate including a light-emitting region, a second flexible substrate facing the first flexible substrate, and frit glass sealing the first flexible substrate and the second flexible substrate so that the light-emitting region is provided on the inner side than the fit glass. The second flexible substrate includes an opening around a region overlapping with the light-emitting region. The opening is filled with the frit glass.

Another embodiment of the present invention is a light-emitting device including a first flexible substrate including a light-emitting region, a second flexible substrate facing the first flexible substrate, and frit glass sealing the first flexible substrate and the second flexible substrate so that the light-emitting region is provided on the inner side than the frit glass. The second flexible substrate includes a first opening in a region overlapping with the light-emitting region and second openings around the first opening. The second openings are filled with the frit glass.

Between a first flexible substrate and a second flexible substrate of a light-emitting device which is one embodiment of the present invention, at least the second flexible substrate is formed of a flexible metal base. A preferable mode is a light-emitting device in which the first flexible substrate is also a flexible metal base. As the flexible metal base, a sheet or a film formed of a material containing a metal element, and specifically, a metal sheet or a metal film of titanium or the like, or an alloy sheet or an alloy film of stainless steel or the like can be used.

In a light-emitting device which is one embodiment of the present invention, a flexible glass substrate (e.g., a sheet-like or film-like thin glass substrate) can be used as the flexible substrate. However, the flexible glass substrate is more likely to be broken by physical impact and bending than the flexible metal base. Further, it is difficult to handle the flexible glass substrate in the process of manufacturing the light-emitting device, which might lead to reduction in the yield of the light-emitting device. Therefore, the flexible metal base is preferably used for each of the first flexible substrate and the second flexible substrate.

In addition, since the flexible metal base does not transmit light, the second flexible substrate provided on the side to which light from the light-emitting element is emitted includes the first opening in the region overlapping with the light-emitting element.

The second flexible substrate includes the openings (second openings) at a position where the frit glass is provided, specifically around the region facing the light-emitting region (i.e., around the first opening). The openings (second openings) are filled with the frit glass. The frit glass is provided on both sides of the second flexible substrate through the openings (second openings), whereby adhesion strength between the second flexible substrate and the frit glass can be increased. Accordingly, hermeticity of the light-emitting device can be further increased.

Note that the openings (second openings) around the region facing the light-emitting region may have any shape which can be filled with the frit glass, e.g., a dot shape or a slit shape. A diameter or a width of the second opening is preferably from 0.02 mm to the width of the frit glass, further preferably from 0.05 mm to 0.15 mm. The ratio of the second openings is preferably from 20% to 80% of the sealant width.

In the light-emitting device, the light-emitting element can be provided in contact with a partition which is provided over a layer including a transistor.

In addition, the light-emitting element provided in the light-emitting device can emit white light. When a coloring layer is provided in a region overlapping with the light-emitting element in an adhesive layer which is provided for the second flexible substrate, light of the particular color can be emitted.

One embodiment of the present invention is a method for manufacturing a light-emitting device which includes the steps of: forming a light-emitting region over a first flexible substrate which includes an insulating layer; providing a second flexible substrate which includes an opening around a region overlapping with the light-emitting region over a supporting base which contains a metal element having reduction reaction by heating; applying and heating frit paste containing low-melting glass and a binder to the opening, thereby forming frit glass containing low-melting glass; separating the second flexible substrate from the supporting base; providing the separated second flexible substrate over the first flexible substrate so that the light-emitting region overlaps with a region on the inner side than the opening; and irradiating the frit glass with laser light, thereby bonding the first flexible substrate, the frit glass, and the separated second flexible substrate.

Another embodiment of the present invention is a method for manufacturing a light-emitting device which includes the steps of: forming a light-emitting region over a first flexible substrate which includes an insulating layer; providing a second flexible substrate which includes a first opening and second openings around the first opening over a supporting base which contains a metal element having reduction reaction by heating; applying and heating frit paste containing low-melting glass and a binder to the second openings, thereby forming frit glass containing low-melting glass; separating the second flexible substrate from the supporting base; providing the separated second flexible substrate over the first flexible substrate so that the light-emitting region overlaps with the first opening; and irradiating the frit glass with laser light, thereby bonding the first flexible substrate, the frit glass, and the separated second flexible substrate.

In the manufacturing method, the second flexible substrate can be provided over the supporting base with a space interposed therebetween and frit glass can be formed in the space. Thus, the openings (second openings) around the region overlapping with the light-emitting region are filled with the frit glass, so that the light-emitting device in which the frit glass is provided around the openings (second openings) on both surfaces of the second flexible substrate can be manufactured.

In the above manufacturing method, the sealant which is in contact with the insulating layer formed over the first flexible substrate and the separated second flexible substrate can be formed in a positive pressure environment and accordingly the first flexible substrate and the separated second flexible substrate can be irradiated with laser light with the inside between the substrates kept in the positive pressure environment. Note that the sealant can be provided on the outer side or the inner side than the position of the frit glass.

In the bonding step using the frit glass, the frit glass formed of the frit paste is preferably irradiated with laser light while pressure is applied to the position of the frit glass so that the first flexible substrate and the separated second flexible substrate are pressed to each other.

Here, laser light can be emitted while pressure in the direction perpendicular to the first flexible substrate is applied to the openings (second openings) which are provided around the region overlapping with the light-emitting region and to around the openings (second openings). For example, when a light-transmitting base (e.g., quartz or the like) is provided in and around the opening (second opening), irradiation of laser light can be performed through the light-transmitting base.

In the above manufacturing method, the adhesive layer can be formed as follows: the separated second flexible substrate in which a light-transmitting adhesive is applied around the first opening is provided over a reinforcement layer, an adhesive is applied to the reinforcement layer in a region overlapping with the first opening, and the adhesive is heated. Note that an organic resin or the like can be used for the reinforcement layer.

In the above manufacturing method, a copper plate, a silver plate, a gold plate, and the like can be used for the supporting base. In the case of manufacturing a light-emitting device which can emit light of the particular color, a coloring layer can be formed on the side of the adhesive layer or on the side opposite to the side where the reinforcement layer is provided.

In the above manufacturing method, since the adhesive layer is formed of the organic resin and has a possibility of transmitting atmospheric components (including moisture and oxygen) more than a little, an inorganic insulating layer which is in contact with the second flexible substrate and covers the adhesive layer and the coloring layer is formed, which makes it possible to suppress the entry of the atmospheric components from the adhesive layer. Accordingly, a light-emitting device with high reliability can be manufactured.

According to one embodiment of the present invention, a light-emitting device which is thin and lightweight and has high flexibility, impact resistance, and reliability can be provided. Further, a light-emitting device which is thin and lightweight and has high flexibility, impact resistance, and hermeticity can be provided.

BRIEF DESCRIPTION OF THE DRAWINGS

FIGS. 4A and 4B are schematic cross-sectional views of a display device.

FIGS. 6A to 6F are schematic cross-sectional views illustrating steps for manufacturing a display device.

FIGS. 8A to 8C are schematic cross-sectional views illustrating steps for manufacturing a display device.

FIGS. 9A to 9C are schematic cross-sectional views illustrating steps for manufacturing a display device.

FIGS. 10A and 10B are schematic cross-sectional views illustrating steps for manufacturing the display device.

FIGS. 12A and 12B are schematic cross-sectional views of a display device.

FIGS. 13A and 13B are a schematic top view and a schematic cross-sectional view of a lighting device.

DETAILED DESCRIPTION OF THE INVENTION

Figure 1:
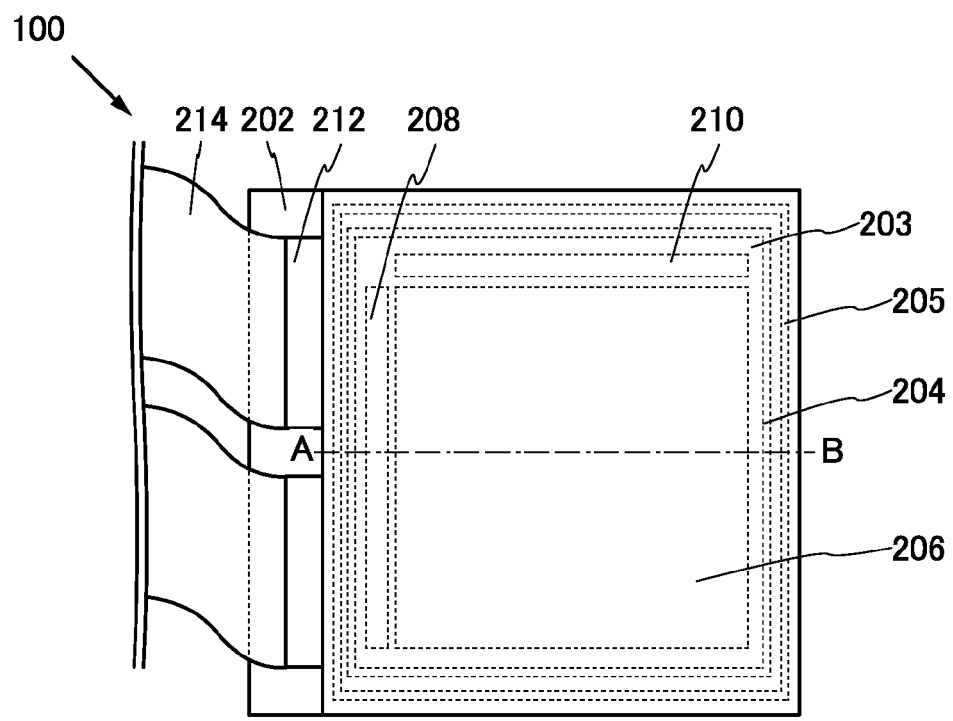
FIG. 1 is a schematic top view of a display device.

Embodiment will be described in detail with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Note that in each drawing described in this specification, a size of each component or a thickness of each layer or an area is exaggerated in some cases for clarification. Therefore, embodiments of the present invention are not limited to such scales.

Embodiment 1

In this embodiment, a light-emitting device which is one embodiment of the present invention and a method for manufacturing the light-emitting device are described. In this embodiment, a display device including a light-emitting element as a light-emitting device and a method for manufacturing the display device are described.

A display device which is one embodiment of the present invention includes a layer including at least a transistor and a light-emitting element between a first flexible substrate and a second flexible substrate each of which has an insulating surface. The first flexible substrate is bonded to the second flexible substrate with frit glass containing low-melting glass.

The first flexible substrate is provided with the layer including a transistor and a light-emitting element. The second flexible substrate is provided on the side to which light from the light-emitting element is emitted. Thus, light can be extracted from the second flexible substrate. That is, the display device which is one embodiment of the present invention is a so-called top-emission type display device, in which light is emitted opposite to a substrate provided with a light-emitting element.

FIG. 1 is a schematic top view of a display device 100 which is one embodiment of the present invention. Note that the display device 100 in this embodiment is an active matrix type display device.

As shown in FIG. 1, the display device 100 includes a first flexible substrate 202 and a second flexible substrate 203, and further includes, in a sealed region surrounded by frit glass 204 and a sealant 205, a pixel portion 206, a scan line driver circuit 208, and a signal line driver circuit 210. Further, a wiring which is electrically connected to the scan line driver circuit 208 and the signal line driver circuit 210 extends from the sealed region, and the wiring is electrically connected to an external input terminal 212. A power source potential and a signal such as a driving signal for driving the scan line driver circuit 208, the signal line driver circuit 210, and the like can be input through an FPC 214 which is electrically connected to the external input terminal 212.

In this embodiment, a driver-integrated structure in which the scan line driver circuit 208 and the signal line driver circuit 210 are formed over the First flexible substrate 202 provided with the pixel portion 206 is described. However, the scan line driver circuit 208 or the signal line driver circuit 210, or both may be formed over a substrate different from the substrate provided with the pixel portion 206.

The external input terminal 212 includes a conductive layer serving as a wiring electrically connected to the scan line driver circuit 208 and the signal line driver circuit 210. That is, the external input terminal 212 can be formed using the conductive layer which is included in a layer 220 including a transistor and a light-emitting element (see FIGS. 4A and 4B). In this embodiment, a conductive layer included in an electrode of a transistor (e.g., a gate electrode) of the layer 220 (see FIGS. 4A and 4B) including a transistor and a light-emitting element or a conductive layer included in an electrode of the light-emitting element is stacked. In this manner, it is preferable that the external input terminal 212 is formed of a stack of a plurality of conductive layers, in which case mechanical strength can be increased. In addition, a connector (not shown) is provided in contact with the external input terminal 212. The FPC 214 is electrically connected to the external input terminal 212 through the connector. Thus, the FPC 214 is electrically connected to the layer 220 (see FIGS. 4A and 4B) including a transistor and a light-emitting element. For a connector (not shown), it is possible to use a paste-like or sheet-like material which is obtained by mixture of metal particles and a thermosetting resin and for which anisotropic electric conductivity is provided by thermocompression bonding. As the metal particles, particles in which two or more kinds of metals are layered, for example, Ni particles coated with Au are preferably used.

The display device 100 which is one embodiment of the present invention has flexibility. At least for the second flexible substrate, a flexible metal base which is more resistant to physical impact and bending than a flexible glass substrate can be used. Note that an organic resin having heat resistance high enough to withstand heat treatment in a process of bonding the first flexible substrate 202 and the second flexible substrate 203 using the frit glass 204 may be used.

Since a flexible metal base does not transmit light, the second flexible substrate is processed so as to extract light emitted from a light-emitting element. In the case where the above-described organic resin whose heat resistance is increased does not transmit light, the organic resin is processed similarly to the flexible metal base.

First, a flexible substrate which can be used as the second flexible substrate of the display device which is one embodiment of the present invention (hereinafter, such a substrate is also referred to as a flexible substrate which is one embodiment of the present invention) is described with reference to FIGS. 2A and 2B and FIGS. 3A and 3B.

<Details on Flexible Substrate>

Figure 2A:
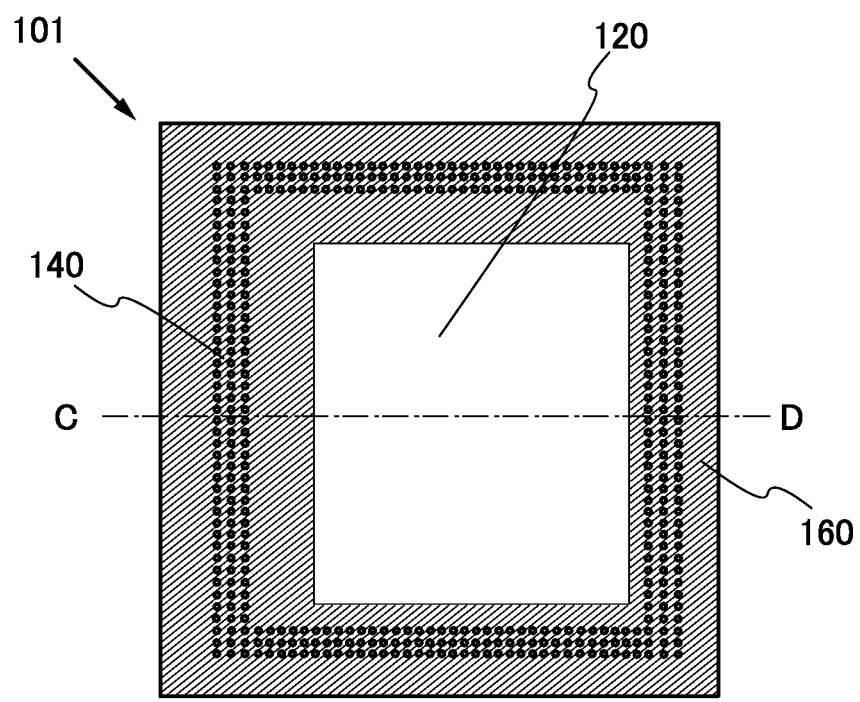
FIGS. 2A and 2B are a schematic top view and a schematic cross-sectional view of a flexible substrate.
Figure 2B:
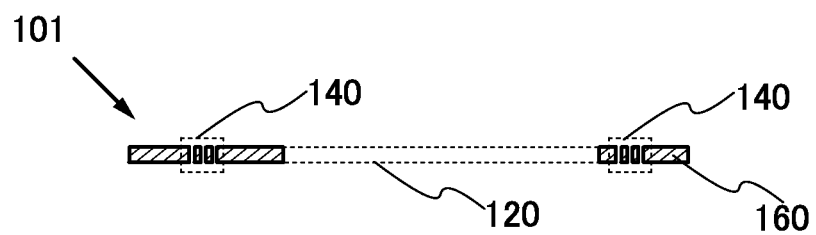

FIG. 2A is a schematic top view of a flexible substrate 101 which is one embodiment of the present invention. FIG. 2B is a schematic cross-sectional view of the flexible substrate 101 shown in FIG. 2A taken along line C-D.

The flexible substrate 101 includes a first opening 120, second openings 140 provided around the first opening 120, and an unprocessed region 160 (see FIGS. 2A and 2B). The unprocessed region 160 is a region in the flexible substrate 101 except the first opening 120 and the second openings 140.

The flexible substrate 101 is formed by processing the above materials, such as a flexible metal base. As the base, a thin base (e.g., a sheet or a film) containing a metal element, specifically, a metal sheet or a metal film of titanium or the like, or an alloy sheet or an alloy film of stainless steel or the like can be used. Among them, a sheet or a film of stainless steel which is relatively inexpensive and available is preferable.

The first opening 120 serves as the pixel portion 206 and a light-emitting region of a manufactured display device and thus can have a desirable size and shape.

The second openings 140 are provided for transmitting light in a base which is more resistant to impact and bending than a flexible glass substrate but does not transmit light. The second openings 140 can be provided along a sealing position of the manufactured display device.

In the manufactured display device, when the frit glass containing low-melting glass is used for sealing in order to increase inner hermeticity, local heating by laser irradiation is effective to form the frit glass. However, since a flexible metal base does not transmit light, it is not preferable to use the base with no processing as a substrate of the display device.

Thus, the second openings 140 are provided in a sealing position of the manufactured display device as in the flexible substrate 101, so that a sealing method using frit glass can be employed for a base which is more resistant to impact and bending than a flexible glass substrate but does not transmit light. Thus, a display device which is thin and lightweight and has high flexibility, impact resistance, and hermeticity can be manufactured.

Figure 3A:
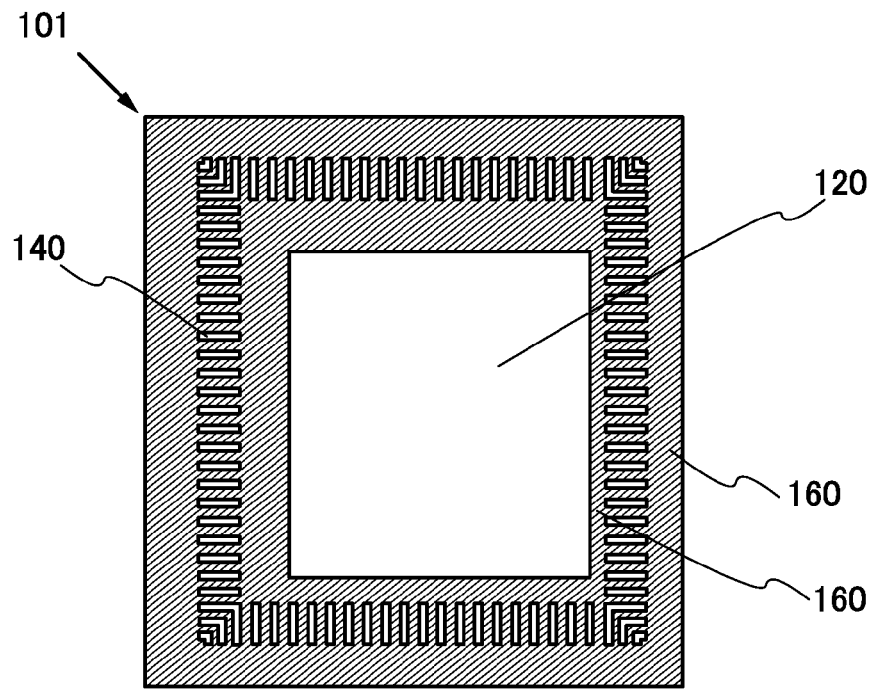
FIGS. 3A and 3B are schematic top views of a flexible substrate.
Figure 3B:
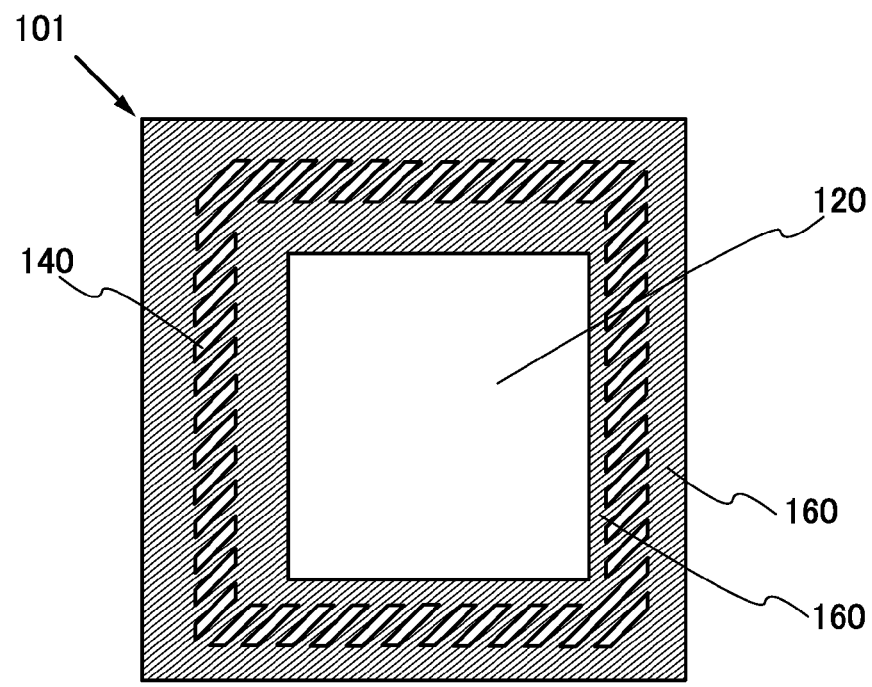

As described above, the second openings 140 can have any shape as long as frit paste provided in the sealing position can be irradiated with laser light. It is preferable that the quantity or irradiation time of laser light per unit area with which frit paste is irradiated be almost uniform in the openings. For example, the second openings 140 may be a dot shape as shown in FIGS. 2A and 2B. Alternatively, as shown in FIG. 3A, the second openings 140 may be a slit shape and provided to be parallel or perpendicular to the side surface of the first opening 120. Alternatively, as shown in FIG. 3B, the second openings 140 may have a slit shape and provided diagonally to the side surface of the first opening 120. Further alternatively, the second opening 140 may be a continuous slit shape in the vertical direction and/or the horizontal direction.

The second opening 140 preferably has a certain size so that the second opening 140 can be filled with frit paste and the frit paste can be also provided around the second opening 140. A diameter or a width of the second opening 140 is preferably from 0.02 mm to the width of the frit glass, further preferably from 0.05 mm to 0.15 mm. Thus, adhesion between formed frit glass and the flexible substrate 101 can be increased by an anchor effect in a display device which uses the flexible substrate 101 and is sealed with the frit glass. As a result, a display device which is thin and lightweight and has high flexibility, impact resistance, and hermeticity can be manufactured. Further, the ratio of the second openings is preferably from 20% to 80% of the sealant width. Accordingly, the frit glass can be sufficiently softened or melted and the mechanical strength of the flexible substrate 101 can be maintained.

The unprocessed region 160 may be processed so that the surface or the rear surface of the flexible substrate 101 has projections and depressions. In particular, in the unprocessed region 160, projections and depressions are preferably formed around the second openings 140. Thus, adhesion between formed frit glass and the flexible substrate 101 can be further increased by an anchor effect.

Note that when wettability of a base which can be used for the flexible substrate 101 is low with respect to the frit paste, adhesion between formed frit glass and the base is not sufficiently obtained in some cases. In such a case, it is preferable to process the unprocessed region 160 to have projections and depressions as described above.

In the flexible substrate 101, the first opening 120 and the second openings 140 can be formed by a conventional metal processing technique. For example, a flexible metal base with no opening is subjected to mold press processing or laser processing by scanning laser light in accordance with a pattern, whereby the first opening 120, the second openings 140, and the unprocessed region 160 can be formed. Note that various methods can be used for forming the flexible substrate 101 without limitation to the above method. For example, the first opening 120, the second openings 140, and the unprocessed region 160 can be formed in/on a base which does not have flexibility, such as a metal plate; then, the base is cut to be thin enough to have flexibility, whereby the flexible substrate 101 is formed.

The above is the description of the flexible substrate which can be applied to the display device of one embodiment of the present invention.

<Details on Display Device>

Next, the display device of one embodiment of the present invention and a method for manufacturing the display device are described in detail.

FIG. 4A is a schematic cross-sectional view of the display device 100 in FIG. 1 taken along line A-B.

As shown in FIG. 4A, the display device 100 has a structure in which the first flexible substrate 202 (also referred to as an element substrate) provided with an insulating layer 218 and the layer 220 including a transistor and a light-emitting element and the second flexible substrate 203 (also referred to as a counter substrate) provided with an adhesive layer 228, an insulating layer 230, a light-blocking layer 234, a coloring layer 232, an insulating layer 236, and a reinforcement layer 238 are sealed with the frit glass 204 and the sealant 205.

The insulating layer 218 is provided over the first flexible substrate 202, and the layer 220 including a transistor and a light-emitting element is provided over the insulating layer 218. The layer 220 including a transistor and a light-emitting element includes a transistor driving a light-emitting element, the scan line driver circuit 208, the signal line driver circuit 210, and a wiring electrically connected to the scan line driver circuit 208 and the signal line driver circuit 210.

The above-described flexible substrate 101 can be used as the second flexible substrate 203. In the second flexible substrate 203, a region overlapping with a light-emitting element of the layer 220 is the first opening 120 in the flexible substrate 101, regions of the second flexible substrate 203 which are in contact with the frit glass 204 is the second openings 140 in the flexible substrate 101, and the other region is an unprocessed region. Hereinafter, also in the second flexible substrate 203, these regions are referred to as the first opening 120, the second openings 140, and the unprocessed region 160 (not shown).

The adhesive layer 228 is provided so as to surround the first opening 120 in the second flexible substrate 203. In other words, the adhesive layer 228 is in contact with the upper surface, the side surface, and the lower surface of the second flexible substrate 203 in the first opening 120.

The insulating layer 230 is provided on the surface of the adhesive layer 228 on the first flexible substrate 202 side. The light-blocking layer 234 is provided on the insulating layer 230 in a region overlapping with part of the light-emitting element of the layer 220 including a transistor and a light-emitting element. The coloring layer 232 is provided in the region where the insulating layer 230 overlaps with the light-emitting element so as to be in contact with the insulating layer 230 and the light-blocking layer 234.

The insulating layer 236 is provided in contact with the second flexible substrate 203, the adhesive layer 228, the insulating layer 230, the light-blocking layer 234, and the coloring layer 232.

The reinforcement layer 238 is provided on the adhesive layer 228 on the side opposite to the side where the insulating layer 230 is provided. The mechanical strength of the second flexible substrate 203 having the first opening 120 and the second openings 140 can be increased by the reinforcement layer 238; thus, the mechanical strength of the display device 100 can be increased.

The frit glass 204 is provided in contact with the second flexible substrate 203 and an inorganic insulating layer (not shown) included in the layer 220 including a transistor and a light-emitting element. The second openings 140 are filled with the frit glass 204 which is in contact with the upper and lower surfaces of the second flexible substrate 203. In particular, the width of a region in contact with the frit glass 204 on the surface of the second flexible substrate 203 opposite to the surface facing the first flexible substrate 202 is larger than the width of the frit glass 204 between the first flexible substrate 202 and the second flexible substrate 203. Thus, in the case where a base whose wettability with respect to frit paste is low is employed as the second flexible substrate 203, adhesion between the second flexible substrate 203 and the frit glass 204 can be increased by an anchor effect, and hermeticity of the display device 100 can be increased. Note that in order to further increase the adhesion between the second flexible substrate 203 and the frit glass 204, projections and depressions may be provided around the second openings 120 in the second flexible substrate 203.

In general, the adhesion of frit glass to a base of a metal-element containing material (e.g., a metal plate, a metal sheet, a metal film, or the like) is low compared with the adhesion of frit glass to a silicon-oxide containing base (e.g., a plate-like, sheet-like, or film-like glass substrate, a silicon oxide film, or the like); however, frit glass can have sufficient adhesion to the above-described processed base by an anchor effect.

The sealant 205 is provided on the outer side than the frit glass 204. In a display device which is one embodiment of the present invention, a position of the sealant 205 is not limited to this and can be the inner side than the frit glass 204 (see FIG. 4B).

As the first flexible substrate 202, a flexible base which can resist laser heating used when forming the frit glass 204 can be used. A thin glass substrate such as a sheet-like or film-like substrate or an organic resin having heat resistance which can be used for the second flexible substrate 203 can be employed; however, a flexible metal base which is resistant to physical impact and bending is preferably used. Note that in this embodiment, the first flexible substrate 202 is a sheet or a film of stainless steel.

The insulating layer 218 is provided to secure insulation with the layer 220 including a transistor and a light-emitting element in the case where a flexible metal base is used for the first flexible substrate 202. The insulating layer 218 is preferably formed using an inorganic insulating film. For example, the inorganic insulating film can have a single-layer structure or a multi-layer structure of an insulating film selected from an oxide insulating film, a nitride insulating film, an oxynitride insulating film, and a nitride oxide insulating film. Note that "nitride oxide" contains more nitrogen than oxygen and "oxynitride" contains more oxygen than nitrogen.

The layer 220 includes a light-emitting element, a switching transistor, and a transistor controlling light emission of the light-emitting element, i.e., a current control transistor. Note that details of the layer 220 including a transistor and a light-emitting element are described later.

The wiring which is included in the layer 220 and electrically connected to the scan line driver circuit 208 and the signal line driver circuit 210 is electrically connected to the transistor of the layer 220 including a transistor and a light-emitting element. The wiring may be formed using a conductive layer included in the transistor or using a conductive layer provided separately from the transistor.

The light-emitting element in this specification is an element in which a layer containing a light-emitting substance is sandwiched between a pair of electrodes. One of the pair of electrodes of the light-emitting element is electrically connected to the transistor of the layer 220 including a transistor and a light-emitting element. The structure, material, and the like of the light-emitting element are described later.

An inorganic insulating layer which is included in the layer 220 and in contact with the frit glass 204 can have a single-layer structure or a multi-layer structure of an inorganic insulating film. The frit glass 204 is an inorganic insulator. In general, adhesion between an inorganic insulator and an organic insulator is low, whereas adhesion between inorganic insulators is higher; thus, it is preferable that an insulating film selected from an oxide insulating film, a nitride insulating film, an oxynitride insulating film, and a nitride oxide insulating film be used as the inorganic insulating layer. For example, part of the transistor (an insulating film) of the layer 220 including a transistor and a light-emitting element can be used. Note that in this embodiment, the inorganic insulating layer is formed of a silicon oxide film.

As the adhesive layer 228, various curable adhesives, e.g., a light curable adhesive such as a UV curable adhesive, a reactive curable adhesive, a thermal curable adhesive, and an anaerobic adhesive can be used. As the material of the adhesives, an epoxy resin, an acrylic resin, a silicone resin, a phenol resin, an acrylate resin, or the like can be used.

When the adhesive layer 228 is formed by mixing a drying agent (zeolite or the like) whose size is less than or equal to the wavelength of light into the adhesive; thus, reliability of the light-emitting element of the layer 220 and the display device 100 can be increased.

The insulating layer 230 is provided to increase the mechanical strength of (to reinforce) the second flexible substrate 203 having the first opening 120 and the second openings 140. In addition, the insulating layer 230 is provided to increase the mechanical strength of the coloring layer 232 and the light-blocking layer 234 and thus handling of the layers in the manufacturing process of the display device 100 becomes easy. Thus, the insulating layer 230 has a certain thickness. The insulating layer 230 can have a single-layer structure or a multi-layer structure using an organic insulating film or an inorganic insulating film. Note that the material which can be used for the insulating layer 218 (i.e., inorganic insulating film) is preferably used for the insulating layer 230. In this embodiment, the insulating layer 230 is formed of a silicon oxide film.

The coloring layer 232 is provided to control the color of light emitted from the light-emitting element of the layer 220, like a color filter. Thus, a position of the coloring layer 232 is not limited to FIGS. 4A and 4B. The coloring layer 232 can be provided in a light path through which light from the light-emitting element passes to the outside. For example, in the case of a full-color display device using white light-emitting elements, a sub-pixel which includes a color filter having a plurality of regions of different colors in one pixel is provided. In this case, three colors of red (R), green (G), and blue (B) or four colors of red (R), green (G), blue (B), and yellow (Y) may be used. Alternatively, a white (W) pixel may be added to R, G, and B (and Y), i.e., color filters of four colors (or five colors) may be used. In the case of a full-color display including not a white light-emitting element but light-emitting elements emitting different colors (e.g., red, green, blue, and the like) as a sub-pixel in one pixel, the coloring layer 232 is not necessarily provided.

The light-blocking layer 234 blocks light emitted from the adjacent light-emitting element, thereby preventing color mixing of the light emitted from the adjacent light-emitting element. Here, the end portions of the coloring layer 232 are provided to overlap with the light-blocking layer 234, whereby light leakage can be suppressed. The light-blocking layer 234 can be formed using a material that blocks light emitted from the light-emitting element. For example, a metal, an organic resin containing a pigment, or the like can be used. Note that the light-blocking layer 234 may be provided in a region other than the pixel portion 206, e.g., in the scan line driver circuit 208.

Note that the display device 100 may include an overcoat layer covering the coloring layer 232 and the light-blocking layer 234. The overcoat layer is formed using a material which transmits light emitted from the light-emitting element; for example, an inorganic insulating film or an organic insulating film can be used. Note that the overcoat layer is not necessarily provided.

The insulating layer 236 is provided to suppress performance degradation of light-emitting elements due to mixture of atmospheric components from the adhesive layer 228 into the display device 100. This is because the adhesive layer 228 is formed of the above-described organic resin and has a possibility of transmitting atmospheric components (including moisture and oxygen) more than a little. Here, the insulating layer 236 is formed of an inorganic insulating film to have a single-layer structure or a multi-layer structure using an insulating film selected from an oxide insulating film, a nitride insulating film, an oxynitride insulating film, and a nitride oxide insulating film. Note that the insulating layer 236 is formed of a silicon oxide film in this embodiment. With the insulating layer 236, reliability of the display device can be increased.

The reinforcement layer 238 is provided to increase the mechanical strength of (to reinforce) the second flexible substrate 203 including the first opening 120 and the second openings 140. The reinforcement layer 238 can be formed using an organic insulating film or an inorganic insulating film and is provided to reinforce the second flexible substrate 203 and thus needs a certain thickness. Thus, the reinforcement layer 238 is preferably formed using an organic resin by which a thick layer is easily formed.

If necessary, an optical film such as a polarizing plate, a circularly polarizing plate (including an elliptically polarizing plate), a retardation plate (a quarter-wave plate or a half-wave plate), or the like may be appropriately provided for the second flexible substrate 203. Further, the polarizing plate or the circularly polarizing plate may be provided with an anti-reflection film. For example, anti-glare treatment by which reflected light can be diffused by projections and depressions on the surface so as to reduce the glare can be performed.

In addition, it is preferable that a member whose refractive index is increased toward the outside of the display device 100 be provided over the layer 220 and that the reinforcement layer 238 in contact with the outside of the display device 100 have projections and depressions. It is preferable that at least the adhesive layer 228 have a refractive index higher than that of the insulating layer 230. Thus, light extraction efficiency of the light-emitting element can be increased. For example, an adhesive layer formed of a transparent adhesive having a high refractive index and capable of bonding substrates or an adhesive layer into which a filler having a high refractive index (e.g., titanium oxide, zirconium, or the like) is mixed can be used as the adhesive layer 228.

<Method for Manufacturing Display Device>

Next, a method for manufacturing the display device 100 will be described with reference to the drawings.

First, a process of forming the insulating layer 218 and the layer 220 over the first flexible substrate 202 (a process of manufacturing the element substrate) is described.

Figure 5A:
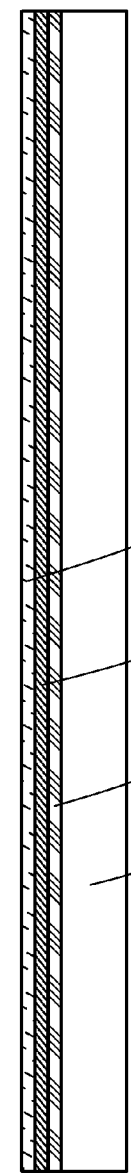
FIGS. 5A to 5C are schematic cross-sectional views illustrating steps for manufacturing a display device.

A separation layer 252 is formed on a supporting base 250. The first flexible substrate 202 is attached onto the separation layer 252. The insulating layer 218 is formed over the first flexible substrate 202 (see FIG. 5A).

A base which does not have flexibility but can withstand the process temperature in this embodiment is preferably used as the supporting base 250. For example, a glass substrate, a quartz substrate, a sapphire substrate, a ceramic substrate, a metal substrate, or the like can be used.

As a glass substrate, in the case where the temperature of the heat treatment to be performed later is high, a glass substrate whose strain point is 730° C. or higher is preferably used. As a glass substrate, a glass material such as aluminosilicate glass, aluminoborosilicate glass, or barium borosilicate glass is used, for example.

In this manner, the first flexible substrate 202 is attached onto the supporting base 250 which does not have flexibility, so that handling of the first flexible substrate 202 in the manufacturing process of the display device 100 becomes easy. Thus, the insulating layer 218 and the layer 220 can be formed over the first flexible substrate 202 with high yield.

In this embodiment, the separation layer 252 is formed in contact with the supporting base 250; however, when a glass substrate is used for the supporting base 250, it is further preferable to form an insulating layer such as a silicon oxide film, a silicon oxynitride film, a silicon nitride film, or a silicon nitride oxide film between the supporting base 250 and the separation layer 252 because contamination from the glass substrate can be prevented by the formation of the insulating layer.

The separation layer 252 includes a first layer containing a material described below, a second layer which is an insulating layer containing an oxide, a third layer serving as an adhesive layer. Note that the separation layer 252 is illustrated by one hatching pattern in FIGS. 5A to 5C.

The first layer has a single-layer structure or a stacked-layer structure containing an element selected from tungsten, molybdenum, titanium, tantalum, niobium, nickel, cobalt, zirconium, ruthenium, rhodium, palladium, osmium, iridium, or silicon; an alloy material containing any of the elements; or a compound material containing any of the elements. A crystal structure of a layer containing silicon may be amorphous, microcrystal, or polycrystal.

The second layer is formed of an oxide insulating film, an oxynitride insulating film, or a nitride oxide insulating film over the first layer. For example, the second layer can be an oxide film of the first layer.

The third layer serving as an adhesive layer can be formed of an adhesive which can withstand the process temperature of this embodiment (e.g., a process temperature in the process of manufacturing the transistor). For example, an adhesive which can be used for the adhesive layer 228 can be used.

The separation layer 252 can be formed by a sputtering method, a plasma CVD method, a coating method, a printing method, or the like. Note that the coating method includes a spin coating method, a droplet discharge method, and a dispensing method.

In the case where the first layer of the separation layer 252 has a single layer structure, it is preferable to form a tungsten layer, a molybdenum layer, or a layer containing a mixture of tungsten and molybdenum. Alternatively, a layer containing an oxide or an oxynitride of tungsten, a layer containing an oxide or an oxynitride of molybdenum, or a layer containing an oxide or an oxynitride of a mixture of tungsten and molybdenum is formed. Note that the mixture of tungsten and molybdenum corresponds to an alloy of tungsten and molybdenum, for example.

The first layer of the separation layer 252 can be a tungsten-containing layer, an oxide insulating layer is formed as the second layer over the first layer, and a layer containing an oxide of tungsten can be formed at an interface between the tungsten layer and the insulating layer. In addition, it is possible to form the layer containing an oxide of tungsten which is the second layer by subjecting the surface of the tungsten-containing layer formed as the first layer to heat oxidation treatment, oxygen plasma treatment, treatment with a solution having strong oxidizing power, such as ozone water, or another treatment. Further, plasma treatment or heat treatment may be performed in an atmosphere of oxygen, nitrogen, or nitrous oxide alone; or an atmosphere of a mixed gas of any of these gasses and another gas.

Any of the above-described bases is used as the first flexible substrate 202. A stainless steel sheet is used in this embodiment.

As the insulating layer 218, the above-described insulating film is formed by a chemical vapor deposition method such as a plasma CVD method a thermal CVD method, or a physical vapor deposition method such as a sputtering method. Note that the insulating layer 218 may be formed by a coating method, a printing method, or the like instead of the above method.

Although the first flexible substrate 202 here is easily separated along the separation layer 252 in a later process, a buffer layer may be formed between the first flexible substrate 202 and the separation layer 252. With the buffer layer, part of the separation layer 252 can be prevented from being attached onto the first flexible substrate 202 after separation.

The buffer layer is preferably formed of a nitrogen-containing insulating film and can have a single-layer structure or a multi-layer structure of silicon nitride, silicon oxynitride, silicon nitride oxide, or the like. The buffer layer can be formed by the above-described physical vapor deposition method, the above-described chemical vapor deposition method, a coating method, a printing method, or the like. For example, the buffer layer is formed at a temperature of higher than or equal to 250° C. and lower than or equal to 400° C. by a plasma CVD method, whereby a dense film having very low water permeability can be obtained. Note that the thickness of the buffer layer is preferably greater than or equal to 10 nm and less than or equal to 3000 nm, further preferably greater than or equal to 200 nm and less than or equal to 1500 nm.

Figure 5B:
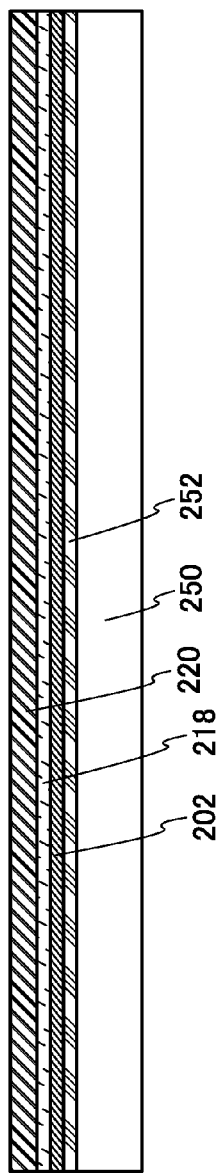

Next, the layer 220 including a transistor and a light-emitting element is formed over the insulating layer 218 (see FIG. 5B). The transistor of the layer 220 including a transistor and a light-emitting element can be formed by a known method for manufacturing a transistor. In the finished display device 100, an inorganic insulating layer which is included in the layer 220 including a transistor and a light-emitting element and in contact with the frit glass 204 is also formed in this process. Note that the external input terminal 212 may be formed by utilizing a process of manufacturing a transistor or separately formed without utilizing the process of manufacturing a transistor.

The light-emitting element of the layer 220 includes a layer containing a light-emitting substance between a pair of electrodes. Specifically, the light-emitting element is formed between a pixel electrode and a common electrode. The structure, material, and the like of the light-emitting element are described later.

Further, the light-emitting element is covered with an inorganic insulating film which does not transmit impurities such as water and oxygen so that the light-emitting element is not exposed, whereby reliability of the light-emitting element and the display device 100 can be improved. An oxide insulating film, a nitride insulating film, an oxynitride insulating film, a nitride oxide insulating film or the like can be used as the inorganic insulating layer. Specifically, an insulating film containing silicon or aluminum can be used.

Figure 5C:
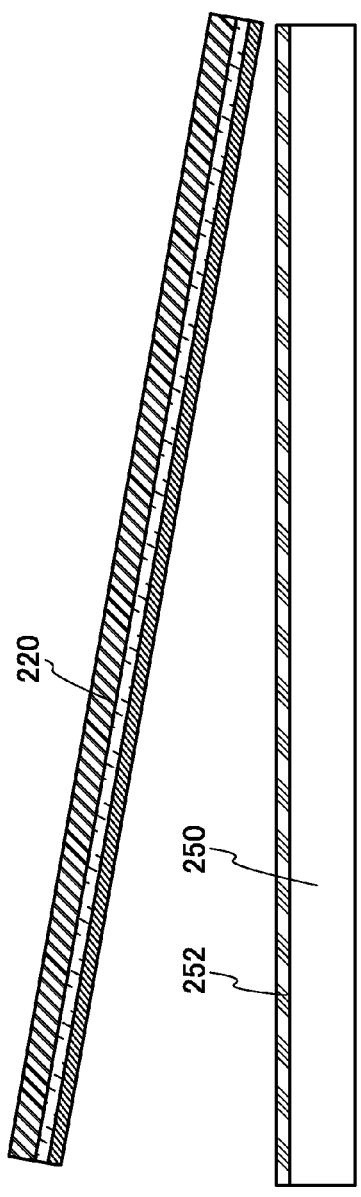

Then, the first flexible substrate 202 is separated along the separation layer formed on the supporting base 250 (see FIG. 5C). As a separation method, any of various methods can be employed.

For example, a metal oxide film is formed at an interface between the supporting base 250 and the separation layer 252 by heating in the process of forming the transistor of the layer 220 including a transistor and a light-emitting element. Part of the metal oxide film is exposed in part of or the entire outer region (e.g., the end portion of the substrate) where separation processing is performed, whereby separation can be performed from a region with low adhesion such as the exposed region. The metal oxide film can be exposed using a scriber apparatus or the like. Alternatively, a groove or the like can be formed in the region with low adhesion using a wedge, a cutter, or the like, whereby separation can be easily performed along the groove.

As the separation method, mechanical force (a separation process with a human hand or with a gripper, a separation process by rotation of a roller, or the like) may be used. Alternatively, liquid can be dropped in the region with low adhesion or the groove formed in the region with low adhesion and an interface between the separation layer 252 and the first flexible substrate 202 is filled with the liquid so that the first flexible substrate 202 is separated along the separation layer 252. At this time, it is preferable that separation be performed while vibration such as ultrasound is applied. Further, electrostatic discharge caused when separating can be suppressed by using water as the liquid, so that a transistor can be prevented from being broken. Alternatively, a method in which a fluoride gas such as $NF_3$, $BrF_3$, or $ClF_3$ is introduced into the region with low adhesion or the groove formed in the region with low adhesion and the separation layer 252 is removed by etching with the use of the fluoride gas, thereby separating the first flexible substrate 202 from the supporting base 250 may be employed.

As another separation method, in the case where the separation layer 252 is formed using tungsten, separation can be performed while the separation layer is etched by a mixed solution of ammonia water and hydrogen peroxide water.

When the first flexible substrate 202 is separated along the separation layer 252 provided on the supporting base 250, the second layer (an insulating layer containing an oxide) and the third layer (an adhesive layer) of the separation layer 252 are attached onto the first flexible substrate 202 in some cases. In this case, the second layer and the third layer can be removed as appropriate by heat treatment or ultraviolet light irradiation. In the case of using a base which transmits atmospheric components more than a little for the first flexible substrate 202, such as an organic resin having heat resistance which can be used for the second flexible substrate 203, the second layer can suppress transmission of atmospheric components.

Through the above-described process, the element substrate can be manufactured.

A process of forming the coloring layer 232, the light-blocking layer 234, the insulating layer 230, the adhesive layer 228, and the reinforcement layer 238 over the second flexible substrate 203 (i.e., a process of manufacturing the counter substrate) is described below.

The separation layer 256 is formed over a substrate 254, the insulating layer 230 is formed over the separation layer 256, and the light-blocking layer 234 is formed over the insulating layer 230 (see FIG. 6A).

A material similar to that of the supporting base 250 can be used for the substrate 254. The separation layer 256 can be formed in a manner similar to that of the separation layer 252.

As described above, the insulating layer 230 is formed using an organic insulating film or an inorganic insulating film. Note that the insulating layer 230 has a function of increasing mechanical strength of (reinforcing) the second flexible substrate 203 and thus has a thickness so that the second flexible substrate 203 can have sufficient mechanical strength. Further, the thickness of the insulating layer 230 is determined considering that the insulating layer 230 has a function of increasing mechanical strength of the coloring layer 232 and the light-blocking layer 234 and handling of the coloring layer 232 and the light-blocking layer 234 in the manufacturing process of the display device 100 becomes easy. For example, the insulating layer 230 preferably has a thickness of 1 µm or more. Here, a silicon oxide film is formed by a chemical vapor deposition method or a physical vapor deposition method. In the case where the insulating layer 230 is formed using an organic insulating film, an organic resin can be used. In the case of using an organic resin, an oxide insulating film of an inorganic material, such as a silicon oxide film, is formed between the separation layer 256 and the insulating layer 230. An organic resin has a high possibility of transmitting atmospheric components (such as water) compared with an inorganic insulating film; however, a thick film can be formed more easily than the case of forming an inorganic insulating film.

The light-blocking layer 234 is formed in a desired position with the above-described material or a known material by a printing method, a coating method, etching using a photolithography technique, or the like.

Next, the coloring layer 232 is formed between the light-blocking layers 234 which are separately provided (see FIG. 6B). Each coloring layer 232 is formed in a desired position with a known material by a printing method, a coating method, etching using a photolithography technique, or the like.

Note that in the case where an overcoat layer covering the coloring layer 232 and the light-blocking layer 234 is provided, the overcoat layer can be formed using the above-described material by a physical vapor deposition method, a chemical vapor deposition method, a coating method, a printing method, or the like. An overcoat layer is not provided in this embodiment in order to suppress dispersion of water and impurity components contained in an overcoat layer to the layer 220 including a transistor and a light-emitting element. The number of processes for forming the overcoat layer can be cut because the overcoat layer is not provided.

Next, the insulating layer 230 is separated from the separation layer 256 formed over the substrate 254 (see FIG. 6C). The above-described separation method can be used as appropriate as the separation process here. For example, the substrate 254 including the separation layer 256, the insulating layer 230, the coloring layer 232, and the light-blocking layer 234 is heated, a metal oxide film is formed over the separation layer 256, the end portions of the metal oxide film are exposed, and separation is performed from the region with low adhesion such as the exposed region. For example, a groove or the like is formed in the region with low adhesion, whereby separation can be easily performed along the groove.

By the separation process, a flexible stacked-layer body 255 in which the coloring layer 232 and the light-blocking layer 234 are formed over the insulating layer 230 can be formed.

Alternatively, the stacked-layer body 255 can be formed as follows. After the process shown in FIG. 6B, an organic resin which is soluble in a solvent is applied so as to cover the coloring layer 232 and the light-blocking layer 234, the organic resin is baked, a protective layer 258 which is soluble in a solvent is formed, an adhesive layer 257 such as a double-sided tape is provided over the protective layer 258, and a supporting base 259 is provided on the adhesive layer 257 (see FIG. 6D). Then, the insulating layer 230 is separated from the separation layer 256 by the above-described separation method (see FIG. 6E), the supporting base 259 is separated from the substrate 254, the protective layer 258 is exposed by removing the adhesive layer 257, and the protective layer 258 is removed using a solvent (see FIG. 6F). By this method, owing to the protective layer 258, the stacked-layer body 255 can be formed without damaging the coloring layer 232, the light-blocking layer 234, and the insulating layer 230. Note that water or alcohol can be used as the solvent. As the organic resin, an epoxy resin, a silicone resin, a phenol resin, an acrylate resin, or the like, which can be used as an adhesive of the adhesive layer 228, can be used. Note that the protective layer 258 has a function of planarizing the insulating layer 230, the coloring layer 232, and the light-blocking layer 234 in order to improve adhesion between the adhesive layer 257 and the insulating layer 230, the coloring layer 232, and the light-blocking layer 234 and adhesion between the adhesive layer 257 and the supporting base 259. Note that in the case of providing an overcoat layer, the protective layer 258 is not necessarily formed. In this case, the stacked-layer body 255 including an overcoat layer can be formed by separating the adhesive layer 257 and the supporting base 259.

Figure 7A:
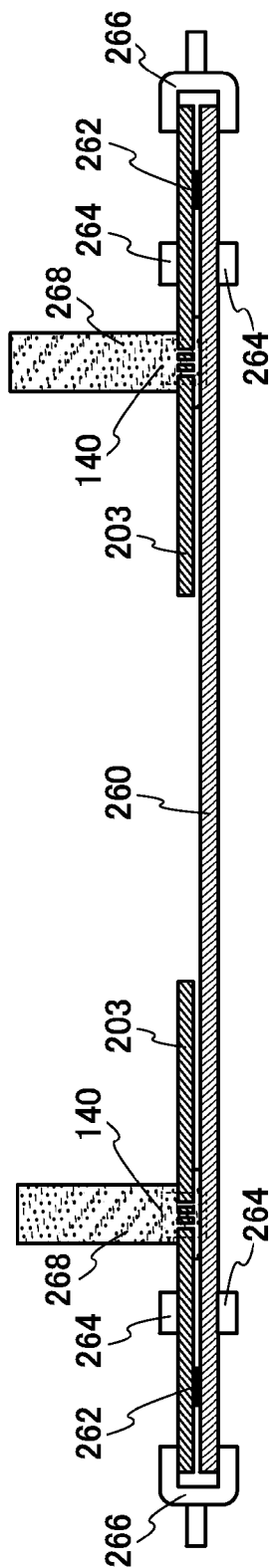
FIGS. 7A to 7C are schematic cross-sectional views illustrating steps for manufacturing a display device.

Next, the second flexible substrate 203 is formed over a supporting base 260 with a space interposed therebetween. The second openings 140 in the second flexible substrate 203 are filled with frit paste containing low-melting glass and a binder and then the frit paste is prebaked, whereby frit glass 268 is formed (see FIG. 7A). When the second openings 140 are filled with the frit paste, frit glass which is formed by heating frit paste is formed in the second openings 140, whereby adhesion between the second flexible substrate 203 and the frit glass can be increased by an anchor effect.

An insulating layer containing an oxide may be provided over the surface of the second flexible substrate 203 before frit paste is applied. For example, the following process may be performed before the second flexible substrate 203 is provided over the supporting base 260: an oxide insulating film is formed by subjecting the second flexible substrate 203 to heat treatment under an atmospheric atmosphere or the like; an oxide insulating film is formed by a chemical vapor deposition method or a physical vapor deposition method; or an oxide insulating film is formed by plasma treatment under an oxygen-containing atmosphere. By such a process, an anchor effect can be increased and adhesion between the second flexible substrate 203 and the frit glass can be increased.

In addition, since the second flexible substrate 203 is provided over the supporting base 260 with the space interposed therebetween, the space is filled with the frit paste. Thus, frit glass is formed also in the space, whereby adhesion between the second flexible substrate 203 and the supporting base 260 can be further increased by an anchor effect.

The space can be provided by temporarily fixing part of the region on the outer side than the second opening 140 in the second flexible substrate 203 (e.g., a scribed end portion of the substrate) with an adhesive 262. The adhesive 262 functions as a spacer between the second flexible substrate 203 and the supporting base 260. Further, a misalignment is suppressed by bonding the second flexible substrate 203 and the supporting base 260. It is further preferable to use one or both of a magnet 264 and a clip 266 to fix the second flexible substrate 203 and the supporting base 260 so that a misalignment does not occur between them.

As the supporting base 260, a base having heat resistance high enough to withstand the processing temperature in the process of manufacturing the counter substrate, adhesive with frit glass formed by heating frit paste is low, and does not have flexibility is used. For example, a metal plate containing a metal element which has reduction reaction by heating, and specifically a copper plate, a silver plate, a gold plate, and the like are given. In this embodiment, a copper plate, which is relatively inexpensive and available, is used. Note that the supporting base 260 can be another metal plate satisfying the above conditions, without limitation to these metal plates.

An adhesive having heat resistance high enough to withstand the processing temperature in the process of manufacturing the counter substrate can be used as the adhesive 262. For example, the adhesive which can be used for the adhesive layer 228 can be used.

Also for the magnet 264, a magnet having heat resistance high enough to withstand the process temperature in the process of manufacturing the counter substrate, e.g., a casting magnet composed of aluminum, nickel, cobalt, and the like (i.e., an alnico magnet), a ferrite magnet, a neodymium magnet, a samarium cobalt magnet, or the like can be used.

Also for the clip 266, a clip having heat resistance high enough to withstand the process temperature in the process of manufacturing the counter substrate can be used. Instead of a clip, a heat-resistant tape may be used for fixing (taping).

The frit paste used in this process is a mixture of a frit material such as low-melting powder glass (low-melting glass) and a binder such as a resin diluted with an organic solvent. Black paste is preferable in order to absorb laser light with which irradiation is performed in a later process. The glass material used for the frit material preferably contains one or more compounds selected from, for example, the following group: magnesium oxide, calcium oxide, barium oxide, lithium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, titanium oxide, tungsten oxide, bismuth oxide, antimony oxide, lead borate glass, tin phosphate glass, vanadate glass, and borosilicate glass. When the frit material is not black, black pigments or metal fillers are mixed. Note that in this specification, the softening point of low-melting glass is 600° C. or lower, preferably 400° C. or lower.

The frit paste is provided in the second openings 140 using a known method, such as a printing method or a coating method. An organic solvent and a binder in the frit paste are removed by prebaking the frit paste, whereby the frit glass 268 can be formed.

Figure 7B:
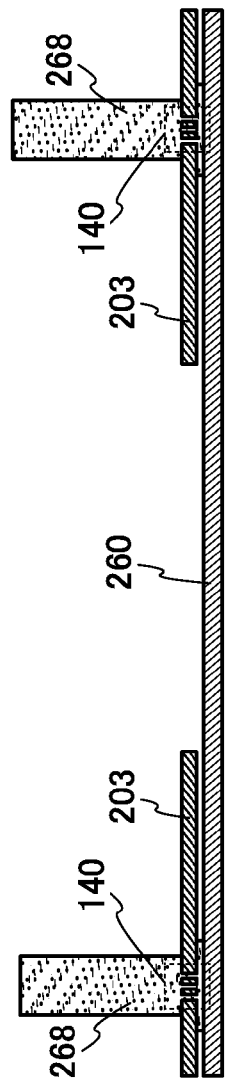

Next, the second flexible substrate 203 and the supporting base 260 are scribed (cut) at a desired position between the second opening 140 and the adhesive 262 so as to have an appropriate size as the counter substrate of the display device 100 (see FIG. 7B). A tool capable of cutting the supporting base 260 is used in this process. For example, a general scriber device, such as a diamond scriber or a laser scriber can be used.

Figure 7C:

Next, the second flexible substrate 203 is detached from the supporting base 260 (see FIG. 7C). The frit glass 268 and the supporting base 260 have low adhesion and are not bonded to each other. This is because the supporting base 260 is likely to have reduction reaction by heating and thus is unlikely bonded with the frit glass. The second flexible substrate 203 is fixed to the supporting base 260 with the adhesive 262, the magnet 264, and the clip 266. Thus, the supporting base 260 can be easily detached from the second flexible substrate 203.

Next, an adhesive which can be used as the adhesive layer 228 is provided on one surface of the reinforcement layer 238. The second flexible substrate 203 which is detached is provided over the adhesive. Then, another adhesive is provided so that the first opening 120 is filled with the adhesive. The stacked-layer body 255 including the coloring layer 232 and the light-blocking layer 234 which are over the insulating layer 230 is attached onto the adhesive. The adhesive is cured, whereby the adhesive layer 228 is formed (see FIG. 8A).

Through the process, the adhesive layer 228 covering around the first opening 120 in the second flexible substrate 203 can be formed, the stacked-layer body 255 can be provided on the surface of the adhesive layer 228 on the element substrate side, and the reinforcement layer 238 can be provided on the other surface of the adhesive layer 228. The adhesive layer 228 may be formed by curing the adhesive material with heat or by curing the adhesive by natural drying under the condition where the second flexible substrate 203 is attached onto the reinforcement layer 238. Note that the adhesive layer 228 may be formed by being irradiated with light such as UV light as long as the coloring layer 232 and the light-blocking layer 234 are not damaged.

In the above method, only the stacked-layer body 255 is attached onto the second flexible substrate 203; however, the stacked-layer body 255 can be provided for the second flexible substrate 203 as follows. The insulating layer 230, the coloring layer 232, and the light-blocking layer 234 (i.e., the stacked-layer body 255) over which the protective layer 258 which is soluble in a solvent, the adhesive layer 257, and the supporting base 259 are provided (the state shown in FIG. 6E) are attached onto an adhesive serving as the adhesive layer 228. The adhesive layer 228 is formed, the adhesive layer 257 is separated from the supporting base 259, and then, the protective layer 258 which is soluble in a solvent is removed, whereby the stacked-layer body 255 is provided over the second flexible substrate 203. In this manner, processing can be performed more accurately than the method of attaching only the stacked-layer body 255; thus, the display device 100 can be manufactured with high yield. Note that in the case of providing an overcoat layer, the protective layer 258 is not necessarily formed. In this case, the stacked-layer body 255 including an overcoat layer can be formed by separating the adhesive layer 257 and the supporting base 259.

Next, the insulating layer 236 covering at least the adhesive layer 228 and the stacked-layer body 255 is formed (see FIGS. 8B and 8C). The insulating layer 236 is formed directly over the stacked-layer body obtained up to the steps illustrated in FIG. 8A, by a chemical vapor deposition method such as a thermal CVD method and a plasma CVD method (see FIG. 8B). At this time, the insulating layer 236 is preferably formed at relatively low temperature (e.g., 200° C. or lower) so that the adhesive layer 228, the insulating layer 230, the coloring layer 232, the light-blocking layer 234, and the reinforcement layer 238 are not damaged. Further, an insulating film deposited at relatively low temperature has a possibility of a low density. Thus, it is further preferable that the insulating layer 236 be formed thick enough to have ability not to transmit atmospheric components (water and the like) (i.e., passivation ability). For example, the insulating layer 236 has a thickness about from 0.1 μm to 1 μm.

The insulating layer 236 may be formed by a physical vapor deposition method such as a sputtering method under the condition where a metal mask 270 is provided over the frit glass 268 and around the second openings 140 (see FIG. 8C). Also in the case of using a physical vapor deposition method, in a manner similar to the case of using a chemical vapor deposition method, it is preferable that the insulating layer 236 be formed so that the adhesive layer 228, the insulating layer 230, the coloring layer 232, the light-blocking layer 234, and the reinforcement layer 238 are not damaged.

Note that the insulating layer 236 may be attached at least onto the adhesive layer 228 and the stacked-layer body 255 using a film formed of an inorganic insulator (an inorganic insulating film) without using a physical vapor deposition method or a chemical vapor deposition method. It is preferable that the inorganic insulating film be attached and heated to be bonded onto the adhesive layer 228 and the stacked-layer body 255.

Through the process described above, a counter substrate can be manufactured.

Next, a process of bonding the element substrate and the counter substrate is described.

The sealant 205 is formed over an insulating layer included in the layer 220 including a transistor and a light-emitting element (see FIG. 9A). The second flexible substrate 203 is provided so that the second flexible substrate 203 faces the first flexible substrate 202 and the frit glass 268 is in contact with the insulating layer. Then, the first flexible substrate 202 is temporarily fixed to the second flexible substrate 203. Then, the frit glass 268 provided over the second flexible substrate 203 is irradiated with laser light 274, whereby the first flexible substrate 202, the frit glass 268, and the second flexible substrate 203 are welded (see FIG. 9B).

An adhesive which can be used for the adhesive layer 228 can be used for the sealant 205. The sealant 205 is formed as appropriate so as to be located on the outer side or the inner side than the frit glass 268. Here, the sealant 205 is formed on the outer side than the frit glass 268. Note that when the sealant 205 is formed on the inner side than the frit glass 268, the display device 100 having a structure shown in FIGS. 4A and 4B can be manufactured.

The sealant 205 can suppress a misalignment between the first flexible substrate 202 and the second flexible substrate 203 in subsequent processes.

The sealant 205 preferably contains a drying agent. When the sealant 205 contains a drying agent, entry of atmospheric components (moisture and the like) into the display device 100 can be suppressed, so that reliability of the light-emitting element of the layer 220 including a transistor and a light-emitting element and the display device 100 can be increased. For the drying agent, a substance which absorbs moisture by chemical adsorption such as alkaline earth metal oxide (e.g., calcium oxide, barium oxide, or the like), or a substance which adsorbs moisture by physical adsorption such as zeolite or silica gel can be used.

In the step shown in FIG. 9B, the frit glass 268 is irradiated with the laser light 274 under the atmospheric pressure. The closed-curved sealant 205 is formed so that the region on the inner side than the sealant 205 and the frit glass 268 (i.e., the sealed region) becomes a positive pressure condition higher than that on the outer side than the sealed region, whereby the second flexible substrate 203 is prevented from being bent when irradiating the frit glass 268 with the laser light 274. Thus, the display device 100 can be manufactured at high yield. In order to make the region a positive pressure condition, the sealant 205 is formed in an inert gas environment and a controlled pressure to temporarily fix the first flexible substrate 202 to the second flexible substrate 203. As an inert gas, a nitrogen gas or a rare gas such as a helium gas, an argon gas, a neon gas, or a krypton gas can be given. Thus, the sealed region of the manufactured display device 100 is filled with an inert gas, so that reliability of the light-emitting element of the layer 220 including a transistor and a light-emitting element and the display device 100 can be increased.

In the process shown in FIG. 9B, the laser light 274 passes through the second openings 140 in the second flexible substrate 203 and also reaches inside the frit glass 268. As a result, the frit glass 268 is heated, softened or melted, and then solidified, whereby the frit glass 268 becomes the frit glass 204 (not shown in FIG. 9B) which seals the first flexible substrate 202 and the second flexible substrate 203. At this time, it is preferable that the frit glass 268 be irradiated with the laser light 274 while pressure is applied in the direction (indicated by a dashed arrow in FIG. 9B) of the first flexible substrate 202 from the position over the frit glass 268 provided on the second flexible substrate 203. In this manner, the first flexible substrate 202 can be sealed with the second flexible substrate 203 without fail, so that hermeticity of the display device 100 can be increased. As a method of applying the pressure, for example, a light-transmitting base (a quartz substrate or the like) for applying pressure is provided at least over the frit glass, preferably around the second openings 140, over the end portion of the second flexible substrate 203, and the like, so that pressure can be applied to the frit glass 268 in a plane. Note that the first flexible substrate 202 and the second flexible substrate 203 may be pressed using a clamp or the like.

There is no particular limitation on the laser light 274; various laser light sources can be used as long as it can heat the frit glass 268. For example, a gas laser typified by an excimer laser or a solid-state laser typified by a YAG laser can be used as a light source. The solid laser is small and excellent in productivity; thus, the wavelength of the laser light is preferably within an infrared light region, and a wavelength of from 780 nm to 2000 nm is employed. For example, laser light having a wavelength of 810 nm or 940 nm is unlikely to be absorbed by an organic resin and heated; thus, the sealant 205 can be formed as close to the frit glass 268 as possible. In addition, the end portion of the pixel portion 206 can be formed as close to the frit glass 268 as possible, so that the frame size of the display device 100 can be narrowed and the resolution of the display device 100 can be increased. Note that the beam shape of the laser light 274 is not particularly limited and can be a rectangular shape, a linear shape, a circular shape, or the like.

In the case where irradiation of the laser light 274 is performed at a higher scanning speed using laser with a higher output, a region on the outer side than the irradiation region is unlikely heated compared with the case where the scanning speed is low. Thus, the diameter of beam is reduced to perform irradiation of the laser light 274 at a high output and high scanning speed, the sealant 205 and the end portion of the pixel portion 206 can be formed as close to the frit glass 268 as possible, so that the frame size of the display device 100 can be narrowed and the resolution of the display device 100 can be increased.

The above is the description of the process of bonding the element substrate and the counter substrate.

Next, the connector is provided in contact with the external input terminal 212, and the FPC 214 is provided in contact with the connecter (see FIG. 1). Note that FIG. 9C shows the frit glass 204 which is formed by softening or melting and solidifying the frit glass 268.

A drying agent may be provided in a region which does not overlap with the layer 220 including a transistor and a light-emitting element in the sealed region. As the drying agent, the above-described drying agent which can be mixed with the sealant 205 can be used. The drying agent is provided in the region, whereby impurities such as moisture can be reduced and reliability of the light-emitting element and the display device 100 can be increased.

Through the above process, the display device 100 can be manufactured.

According to one embodiment of the present invention, a display device which is thin and lightweight and has high flexibility, impact resistance, and reliability can be manufactured. Further, a display device which is thin and lightweight and has high flexibility, impact resistance, and hermeticity can be manufactured.

Note that this embodiment can be implemented in combination with any of the structures described in other embodiments, as appropriate.

Embodiment 2

In this embodiment, as a method for manufacturing the light-emitting device which is one embodiment of the present invention, a method which is partly different from the manufacturing method in the above embodiment is described. Note that also in this embodiment, the display device 100 is exemplified.

The manufacturing method described in this embodiment is different from the manufacturing method described in Embodiment 1 in that frit glass is also formed over the first flexible substrate 202 (specifically, an insulating layer included in a transistor in the layer 220 including the transistor and a light-emitting element).

First, the separation layer 252, the first flexible substrate 202, the insulating layer 218, and a transistor are formed over the supporting base 250. Frit glass 276 is formed over an insulating layer included in the transistor and then a light-emitting element is formed to be in contact with the transistor, whereby the layer 220 including a transistor and a light-emitting element is formed (see FIG. 10A). The process shown in FIGS. 5A and 5B and the process of forming the frit glass 268 described in Embodiment 1 can be referred to for the process of forming the layer 220 including a transistor and a light-emitting element and the frit glass 276. Through the above process, an element substrate can be manufactured.

Then, the first flexible substrate 202 is separated from the separation layer 252 formed over the supporting base 250 (see FIG. 10B). The process in Embodiment 1 can be referred to for this process.

Next, a counter substrate including the second flexible substrate 203 is formed in a manner similar to that in Embodiment 1 (see FIGS. 6A to 6F, FIGS. 7A to 7C, and FIGS. 8A to 8C).

The sealant 205 is provided over the element substrate and then a counter substrate is provided over the element substrate so that the frit glass 268 provided on the counter substrate is in contact with the frit glass 276 provided on the element substrate. Then, the frit glass 276 and the frit glass 268 are irradiated with the laser light 274, whereby the frit glass 204 is formed and thus the element substrate is bonded to the counter substrate. Then, the connecter is provided in contact with the external input terminal 212. The FPC 214 is provided in contact with the connecter. The process in Embodiment 1 can be referred to for this process (see FIGS. 9A to 9C).

Through the above process, the display device 100 can be manufactured. In the manufacturing method described in this embodiment, frit glass each provided on the element substrate and the counter substrate is welded to each other; thus, the element substrate and the counter substrate can be bonded more tightly than in the manufacturing method described in Embodiment 1. Accordingly, hermeticity of the display device 100 can be increased.

According to one embodiment of the present invention, a display device which is thin and lightweight and has high flexibility, impact resistance, and reliability can be manufactured. Further, a display device which is thin and lightweight and has high flexibility, impact resistance, and hermeticity can be manufactured.

Note that this embodiment can be implemented in combination with any of the structures described in other embodiments, as appropriate.

Embodiment 3

In this embodiment, as a light-emitting device of one embodiment of the present invention, a light-emitting device which is partly different from the light-emitting device described in the above embodiment is described. Further, a method for manufacturing the light-emitting device is described. Note that also in this embodiment, the display device 100 is exemplified.

Figure 11A:
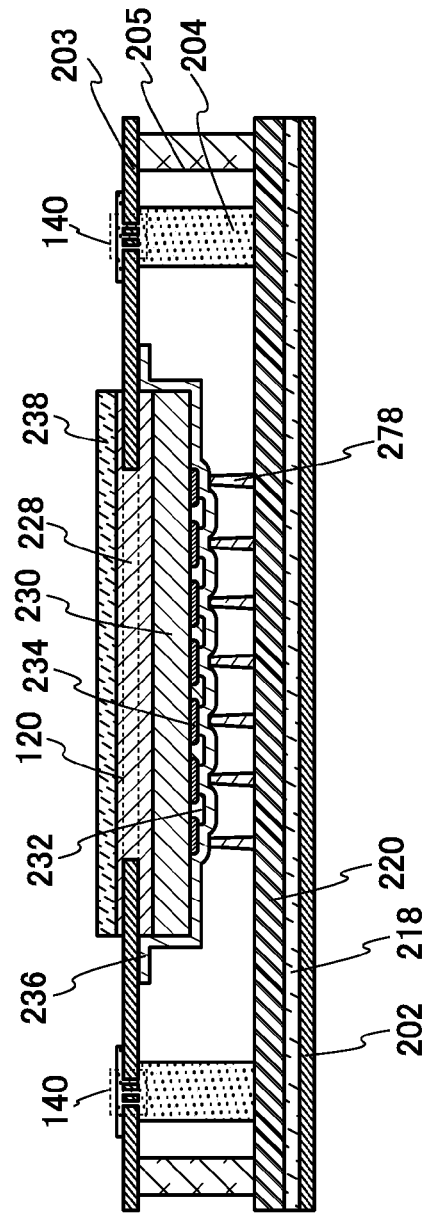
FIGS. 11A and 11B are schematic cross-sectional views of a display device.

The display device described in this embodiment is different from the display device 100 in that a spacer is provided between an element substrate and a counter substrate (see FIG. 11A).

The display device described in this embodiment includes a spacer 278 which is in contact with the layer 220 including a transistor and a light-emitting element and the insulating layer 236. In particular, the spacer 278 is preferably provided in a position overlapping with the light-blocking layer 234. Although not shown in FIGS. 11A and 11B, the spacer 278 may be provided over a partition which covers the outer region of one of a pair of electrodes of the light-emitting element and is in contact with a layer containing a light-emitting substance of the light-emitting element.

With the spacer 278, a display device with higher mechanical strength than the display device 100 can be manufactured.

The spacer 278 can be formed before the light-emitting element is formed in the process of forming the layer 220 including a transistor and a light-emitting element. Note that the spacer 278 can be formed by a known method or technique.

Further, when the spacer 278 is provided, a manufacturing method partly different from that in the above embodiment can be employed.

In the method for manufacturing the display device 100 described in the above embodiment, when the element substrate is provided over the counter substrate and the sealant 205 is formed, the closed-curved sealant 205 is formed so that the sealed region has a positive pressure condition higher than that on the outer side than the sealed region, whereby the counter substrate is prevented from being bent when irradiating with the laser light 274 under atmospheric pressure. On the other hand, the spacer 278 is formed before formation of the sealant 205 in this embodiment. Thus, when the sealant 205 is formed in a reduced pressure environment (typically, lower than the atmospheric pressure) and then irradiation with laser light is performed under the atmospheric pressure, the element substrate is not bent and can be irradiated with laser light without application of force in the element substrate direction. This is because the sealed region is reduced in pressure and the spacer 278 serves as a support. Accordingly, the frit glass, the element substrate, and the counter substrate which are tightly in contact with each other can be welded under the atmospheric pressure without using a light-transmitting base for applying pressure (e.g., a quartz substrate or the like), a clamp, or the like. In this manner, the sealed region of the manufactured display device 100 is in a reduced pressure atmosphere; thus, reliability of the light-emitting element and the display device 100 can be increased. When the sealant 205 is formed in a reduced pressure environment (typically, lower than the atmospheric pressure) and then irradiation with laser light is performed under an atmosphere with the same pressure, a light-transmitting base (e.g., a quartz substrate or the like) for applying pressure, a clamp, or the like is provided at least over the frit glass 268, preferably around the second openings 140, over the end portion of the second flexible substrate 203, and the like and accordingly the frit glass, the element substrate, and the counter substrate which are tightly in contact with each other can be welded.

Figure 11B:
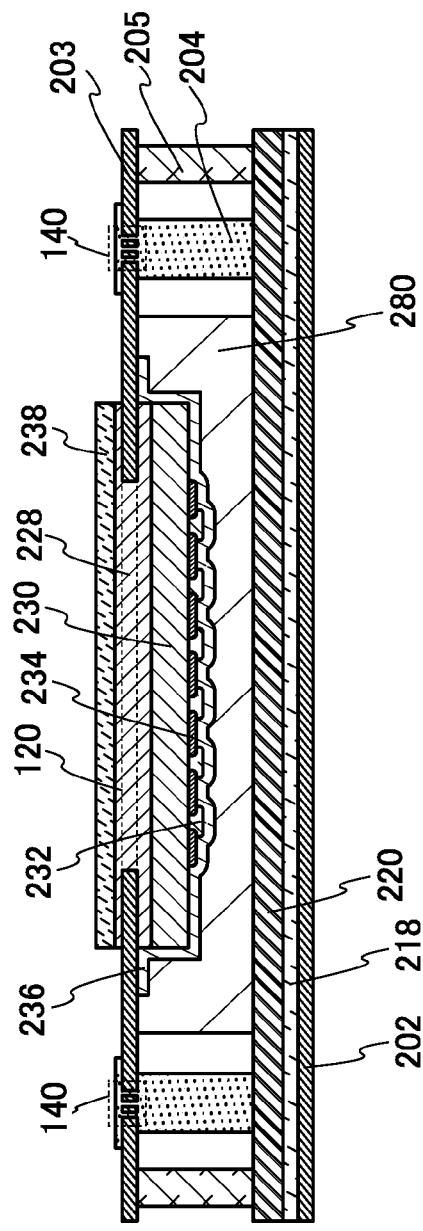

As shown in FIG. 11B, the sealed region may be filled with a filler 280 which is a solid such as an organic resin or a viscous material such as gel. Here, each of the element substrate and the counter substrate is provided with an organic resin. When the sealant 205 is provided, the counter substrate is provided over the element substrate so that the organic resins are in contact with each other, whereby the sealed region can be filled with the organic resin. Alternatively, a viscous material may be provided over the element substrate when the sealant 205 is provided, whereby the sealed region may be filled with the viscous material.

Note that when the sealed region is filled with the filler 280, a distance from the frit glass to the end portion of the filler 280 is preferably controlled as appropriate so that the filler 280 is not resolved or evaporated by heat due to laser light irradiation.

The filler 280 can suppress impurities such as water and oxygen in the sealed region; thus, reliability of the light-emitting element and the display device 100 can be increased.

Therefore, the display device described in this embodiment has higher mechanical strength than the display device described in the above embodiment. Further, since the frit glass, the element substrate, and the counter substrate can be tightly in contact with each other under the atmospheric pressure, the element substrate can be easily bonded to the counter substrate.

Thus, a display device which is thin and lightweight and has high flexibility, impact resistance, and reliability can be manufactured. Further, a display device which is thin and lightweight and has high flexibility, impact resistance, and hermeticity can be manufactured.

Note that this embodiment can be implemented in combination with any of the structures described in other embodiments, as appropriate.

Embodiment 4

In this embodiment, a pixel portion and a driver circuit included in a display device which is one embodiment of the present invention are described.

FIGS. 12A and 12B are parts of schematic cross-sectional views illustrating the cross-sectional view of the display device 100 in FIG. 4A in more detail. Note that FIGS. 12A and 12B each illustrate part of the pixel portion 206 and the scan line driver circuit 208 provided in the sealed region of the display device 100.

FIGS. 12A and 12B each illustrate an example in which the scan line driver circuit 208 includes an NMOS circuit in which an n-channel transistor 411 and an n-channel transistor 412 are combined over the insulating layer 218 over the first flexible substrate 202. The scan line driver circuit 208 is not limited to an NMOS circuit and may have a variety of circuits such as a CMOS circuit in which an n-channel transistor and a p-channel transistor are used in combination or a PMOS circuit formed of a p-channel transistor. Note that the same applies to the signal line driver circuit 210.

FIGS. 12A and 12B each illustrate a cross-sectional structure of one pixel as an example of the pixel portion 206. The pixel includes a switching transistor 413, a current control transistor 414, and a pixel electrode 423 that is electrically connected to an electrode (a source electrode or a drain electrode) of the current control transistor 414. In addition, a partition 417 covering the end portion of the pixel electrode 423 is provided.

Note that there is no particular limitation on the structures of the transistors included in the pixel portion 206, the scan line driver circuit 208, and the signal line driver circuit 210. For example, a forward staggered transistor or an inverted staggered transistor may be used. Furthermore, a top-gate transistor or a bottom-gate transistor may be used. As a material of a semiconductor used for the transistors, for example, a semiconductor material such as silicon or germanium or an oxide semiconductor containing at least one of indium, gallium, and zinc may be used. Further, there is no particular limitation on the crystallinity of a semiconductor used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of transistor characteristics can be reduced.

The layer 220 (not shown) including a transistor and a light-emitting element of the display device 100 includes at least a transistor 411, a transistor 412, a transistor 413, a transistor 414, and a light-emitting element 226.

The light-emitting element 226 includes the pixel electrode 423 and a common pixel electrode 427 which are a pair of electrodes and an EL layer 425 which is a layer containing a light-emitting substance. The light-emitting element 226 can be provided over an intermediate insulating layer which is provided over a transistor included in the pixel portion 206, the scan line driver circuit 208, and the signal line driver circuit 210 (see FIG. 12A). Alternatively, the light-emitting element 226 may be provided in the processed region of the intermediate insulating layer which is provided over a transistor included in the pixel portion 206, the scan line driver circuit 208, and the signal line driver circuit 210 (see FIG. 12B). Note that the structure, material, and the like of the light-emitting element will be described in detail later.

The coloring layer 232 overlapping with the light-emitting element 226 is provided. In addition, the light-blocking layer 234 overlaps with the partition 417 and the end portion of the light-blocking layer 234 is covered with the coloring layer 232. The above embodiment can be referred to for the coloring layer 232 and the light-blocking layer 234. Note that the above embodiment can be referred to for the insulating layer 230 including the coloring layer 232 and the light-blocking layer 234, the adhesive layer 228, and the reinforcement layer 238.

As conductive materials for the pixel electrode 423 and the common pixel electrode 427, a material that transmits light emitted from the EL layer 425 is used for an electrode through which light is transmitted, and a material that reflects light emitted from the EL layer 425 is used for an electrode provided on the side opposite to the electrode through which light is transmitted.

In this structural example, a reflective material is used for the pixel electrode 423 and a light-transmitting material is used for the common pixel electrode 427. Thus, light emission from the EL layer 425 is transmitted through the first opening 120 in the second flexible substrate 203.

As the light-transmitting material that can be used for the electrode (the common pixel electrode 427) through which light is transmitted, indium oxide, indium oxide-tin oxide, indium oxide-zinc oxide, zinc oxide, zinc oxide to which gallium is added, graphene, and the like can be used. Other examples are a metal material such as gold, silver, platinum, magnesium, nickel, tungsten, chromium, molybdenum, iron, cobalt, copper, palladium, and titanium; and an alloy material containing any of these metal materials. A nitride of the metal material (e.g., titanium nitride) or the like may also be used. In the case of using the metal material (or the nitride thereof), the conductive layer may be thinned so as to be able to transmit light. Alternatively, a stack of any of the above materials can be used as the conductive layer. For example, a stacked film of a silver-magnesium alloy and indium oxide-tin oxide is preferably used, in which case electrical conductivity can be increased.

Note that the conductive oxide used as the electrode through which light is emitted can be formed by a sputtering method. When an electrically conductive oxide film is formed under an atmosphere containing argon and oxygen, the light-transmitting property can be increased.

Further, in the case of a top-emission structure, it is preferable that the conductive oxide film formed over the EL layer 425 be a stacked layer film of a first conductive oxide film formed under an atmosphere containing argon with reduced oxygen concentration and a second conductive oxide film formed under an atmosphere containing argon and oxygen, in which case film formation damage to the EL layer 425 can be reduced. In this case, in the formation of the first conductive oxide film, it is preferable to use an argon gas with purity, for example, an argon gas whose dew point is lower than or equal to −70° C., more preferably lower than or equal to −100° C.

As a light-reflecting material that can be used for the electrode (the pixel electrode 423) provided on the side opposite to the electrode through which light is transmitted, the following can be used: a metal material such as aluminum, gold, platinum, silver, nickel, tungsten, chromium, molybdenum, iron, titanium, cobalt, copper, and palladium; or an alloy material containing any of these metal materials. Alternatively, lanthanum, neodymium, germanium, or the like may be added to a metal or an alloy containing the metal material. In addition, any of the following can be used: alloys containing aluminum (aluminum alloys) such as an alloy of aluminum and titanium, an alloy of aluminum and nickel, and an alloy of aluminum and neodymium; and alloys containing silver such as an alloy of silver and copper and an alloy of silver and magnesium. An alloy of silver and copper is preferable because of its high heat resistance. Further, a metal film or a metal oxide film is stacked on and in contact with an aluminum alloy film, whereby oxidation of the aluminum alloy film can be prevented. As examples of a material for the metal film or the metal oxide film, titanium, titanium oxide, and the like are given. Alternatively, a stack of a film containing any of the above light-transmitting materials and a film containing any of the above metal materials may be used. For example, a stacked film of silver and indium oxide-tin oxide, a stacked film of a silver-magnesium alloy and indium oxide-tin oxide, or the like can be used.

The partition 417 is provided to cover the end of the pixel electrode 423. Moreover, the upper end portion or the lower end portion of the partition 417 preferably has a curved surface with a radius of curvature of 0.2 μm to 3 μm in order to be adequately covered with the common pixel electrode 427 which is formed over the partition 417. The side surface of the partition 417 is preferably an inclined curved surface. The insulating layer 217 can be formed using an organic compound such as a negative photosensitive resin which becomes insoluble in an etchant by light or a positive photosensitive resin which becomes soluble in an etchant by light, or an inorganic compound such as silicon oxide or silicon oxynitride.

Thus, a display device which is thin and lightweight and has high flexibility, impact resistance, and reliability can be manufactured. Further, a display device which is thin and lightweight and has high flexibility, impact resistance, and hermeticity can be manufactured.

Note that this embodiment can be implemented in combination with any of the structures described in other embodiments, as appropriate.

Embodiment 5

In this embodiment, as an example of the light-emitting device which is one embodiment of the present invention, a structure example of a lighting device including a light-emitting element will be described. Note that description of the same portions as those in the above embodiment is omitted or simplified.

FIG. 13A is a schematic top view of a lighting device 300 described in this embodiment.

The lighting device 300 includes a light-emitting portion 301 in a sealed region surrounded by the first flexible substrate 202, the second flexible substrate 203, and the frit glass 204. In addition, an extraction electrode 311 and an extraction electrode 312 which are electrically connected to the light-emitting portion 301 and supply power which causes the light-emitting portion 301 to emit light are provided to extend from the sealed region.

FIG. 13B is a schematic cross-sectional view along the line E-F, which cuts a region including the light-emitting portion 301, the extraction electrode 311, and the extraction electrode 312.

The lighting device 300 has a structure in which the first flexible substrate 202 (also referred to as an element substrate) provided with an insulating layer 218, the extraction electrodes 311 and 312, the light-emitting element 226, and the insulating layer 222 and the second flexible substrate 203 (also referred to as a counter substrate) provided with the adhesive layer 228, the insulating layer 230, the insulating layer 236, and the reinforcement layer 238 are sealed with the frit glass 204 and the sealant 205.

The frit glass 204 is in contact with the insulating layer 222 and the second openings 140 in the second flexible substrate 203 are filled with the frit glass 204, so that the first flexible substrate 202 is bonded to the second flexible substrate 203. The frit glass 204 can have any of the structures described in the above embodiments. A method of bonding the element substrate and the counter substrate is the same as in the above embodiments.

The extraction electrode 311 is electrically connected to one of a pair of electrodes included in the light-emitting element 226 (e.g., the pixel electrode 423 in FIGS. 12A and 12B). The extraction electrode 312 is electrically connected to the other of the pair of electrodes included in the light-emitting element 226. For example, the extraction electrode 311, the extraction electrode 312, and the one of the pair of electrodes included in the light-emitting element 226 can be formed on the same plane as one layer. The other of the pair of electrode included in the light-emitting element 226 (e.g., the common pixel electrode 427 in FIGS. 12A and 12B) can be formed so as to be in contact with the extraction electrode 312.

Although not illustrated, an insulating layer (corresponding to the partition 417 in FIGS. 12A and 12B) formed of an organic insulating film or an inorganic insulating film is preferably provided at the end portion of the light-emitting element 226 in order to prevent conduction between the pair of electrodes of the light-emitting element 226.

Here, the lighting device 300 is top-emission type like the display device 100. The light-emitting element 226 can be formed with reference to the above embodiments.

The insulating layer 222 in the lighting device 300 is separately formed using an inorganic insulating film after the light-emitting element 226 is formed. The inorganic insulating film can have a single-layer structure or a multi-layer structure of an insulating film selected from an oxide insulating film, an oxynitride insulating film, and a nitride oxide insulating film and may cover the light-emitting element 226. Note that the insulating layer 222 is an inorganic insulating layer corresponding to an insulating layer included in the layer 220 including a transistor and a light-emitting element of the display device 100.

In order to support the conductivity of the pair of electrodes of the light-emitting element 226, an auxiliary electrode containing a low-resistant conductive material may be provided. In particular, in the case of the lighting device 300 having a large area, a potential drop due to the electrode resistance may cause luminance distribution; therefore, it is effective to provide the auxiliary electrode.

For example, an auxiliary electrode is provided in contact with an upper surface or a bottom surface of the one of the pair of electrodes of the light-emitting element 226. Alternatively, an auxiliary electrode which is electrically connected to the other of the pair of electrodes is provided over the one of the pair of electrodes of the light-emitting element 226 with an insulating layer provided therebetween. In the case of providing an auxiliary electrode which is in contact with the one of the pair of electrodes, a step formed by the auxiliary electrode is preferably covered with the insulating layer 222 or an insulating layer which is provided to be in contact with the light-emitting element 226.

Although not shown, a drying agent may be provided in a region which does not overlap with the light-emitting element, and the sealed region. As the drying agent, the drying agent described in the above embodiments can be used.

According to one embodiment of the present invention, a lighting device which is thin and lightweight and has high flexibility, impact resistance, and reliability can be manufactured. Further, a lighting device which is thin and lightweight and has high flexibility, impact resistance, and hermeticity can be manufactured.

Note that this embodiment can be implemented in combination with any of the embodiments described in this specification as appropriate.

Embodiment 6

In this embodiment, an example of a light-emitting element which can be used as the light-emitting element 226 included in the light-emitting device described in the above embodiment is described with reference to drawings.

Figure 14A:
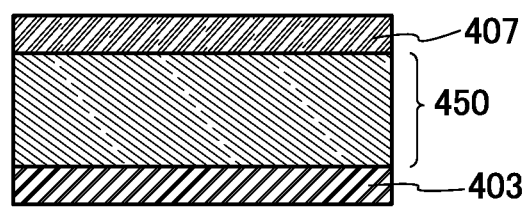
FIGS. 14A and 14B illustrate a light-emitting element of a light-emitting device.

The light-emitting element shown in FIG. 14A has a structure in which the EL layer 450 including a light-emitting region is interposed between a pair of electrodes (the first electrode 403 and the second electrode 407). The first electrode 403 and the second electrode 407 can be used as the pixel electrode 423 and the common pixel electrode 427 of the light-emitting device which is described in the above embodiment.

The EL layer 450 includes at least a light-emitting layer and may have a stacked structure including a functional layer in addition to the light-emitting layer. Examples of the functional layer other than the light-emitting layer include a layer containing a substance having a high hole-injection property, a substance having a high hole-transport property, a substance having a high electron-transport property, a substance having a high electron-injection property, a bipolar substance (a substance having high electron and hole transport properties), or the like. Specifically, functional layers such as a hole-injection layer, a hole-transport layer, an electron-transport layer, and an electron-injection layer can be used in combination as appropriate.

The light-emitting element illustrated in FIG. 14A emits light when current flows because of the potential difference generated between the first electrode 403 and the second electrode 407, and holes and electrons are recombined in the EL layer 450. That is, the light-emitting region is formed in the EL layer 450.

Figure 14B:
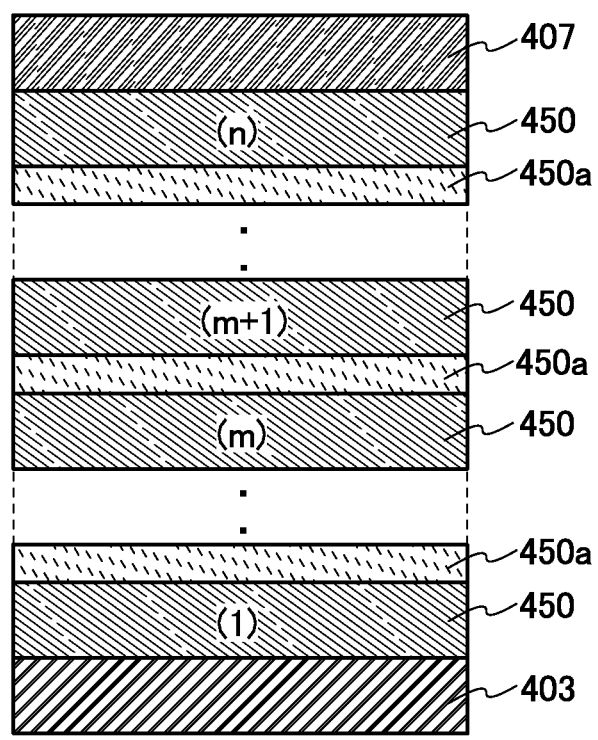

Note that a plurality of EL layers 450 may be stacked between the first electrode 403 and the second electrode 407 as illustrated in FIG. 14B. In the case where n (n is a natural number of 2 or more) layers are stacked, a charge generation layer 450a is preferably provided between each m-th (m is a natural number of from 1 to n−1) EL layer and each (m+1)-th EL layer.

The charge generation layer 450a can be formed using a composite material of an organic compound and a metal oxide, a metal oxide, or a composite material of an organic compound and alkali metal, alkaline earth metal, or a compound thereof. Examples of the composite material of an organic compound and a metal oxide include composite materials of an organic compound and a metal oxide such as vanadium oxide, molybdenum oxide, and tungsten oxide. As the organic compound, various compounds such as an aromatic amine compound, a carbazole derivative, aromatic hydrocarbon, and a high molecular compound (oligomer, dendrimer, polymer, or the like) can be used. As the organic compound, it is preferable to use the organic compound which has a hole-transport property and has a hole mobility of $10^{-6}$ cm$^2$/Vs or higher. However, other substances than the above described materials may also be used as long as the substances have higher hole-transport properties than electron-transport properties. These materials used for the charge generation layer 450a are excellent in carrier-injection properties and carrier-transport properties, so that the light-emitting element shown in FIGS. 14A and 14B can be driven at low current at low voltage.

It is to be noted that the charge generation layer 450a may be formed with a combination of a composite material of an organic compound and metal oxide and another material. For example, a layer containing a composite material of the organic compound and the metal oxide may be combined with a layer containing a compound of a substance selected from substances with an electron-donating property and a compound with a high electron-transport property. Moreover, a layer containing a composite material of the organic compound and the metal oxide may be combined with a transparent conductive film.

As for a light-emitting element having such a structure, problems such as energy transfer and quenching occur with difficulty, and a light-emitting element which has both high light emission efficiency and long lifetime can be easily obtained due to expansion in the choice of materials. Further, a light-emitting element which provides phosphorescence from one of light-emitting layers and fluorescence from the other of the light-emitting layers can be easily obtained.

The charge generation layer 450a has a function of injecting holes to one of the EL layers 450 which is formed in contact with the charge generation layer 450a and a function of injecting electrons to the other of the EL layers 450 which is formed in contact with the charge generation layer 450a, when a voltage is applied to a first electrode 403 and a second electrode 407.

The light-emitting element shown in FIG. 14B can provide a variety of emission colors by changing the type of the light-emitting substance that is used for the EL layer 450. In addition, a plurality of light-emitting substances of different colors is used as the light-emitting substance, whereby light emission having a broad spectrum or white light emission can also be obtained.

In the case of obtaining white color light using the light-emitting element shown in FIG. 14B, as for the combination of a plurality of EL layers, a structure for emitting white light including red light, green light, and blue light may be used, e.g., the structure may include a first light-emitting layer containing a blue fluorescent substance as a light-emitting substance and a second light-emitting layer containing red and green phosphorescent substances as light-emitting substances. Alternatively, a structure including a first light-emitting layer exhibiting red light, a second light-emitting layer exhibiting green light, and a third light-emitting layer exhibiting blue light may be employed. Also with a structure including light-emitting layers emitting light of complementary colors, white light emission can be obtained. When light emitted from the first light-emitting layer and light emitted from the second light-emitting layer have complementary colors to each other in a stacked-layer element including two light-emitting layers, the combination of colors are as follows: blue and yellow, blue-green and red, and the like.

Note that in the structure of the above-described stacked-layer element, by providing the charge generation layer between the stacked light-emitting layers, the element can have long lifetime in a high-luminance region while keeping the current density low. In addition, the voltage drop due to resistance of the electrode material can be reduced, whereby uniform light emission in a large area is possible.

This embodiment can be combined with any of the other embodiments disclosed in this specification as appropriate.

Embodiment 7

In this embodiment, examples of an electronic device or a lighting device using an light-emitting device in accordance with one embodiment of the present invention will be described with reference to FIGS. 15A and 15B and FIGS. 16A to 16D.

A mobile phone including the display device described in the above embodiment is described with reference to FIGS. 15A and 15B.

Figure 15A:
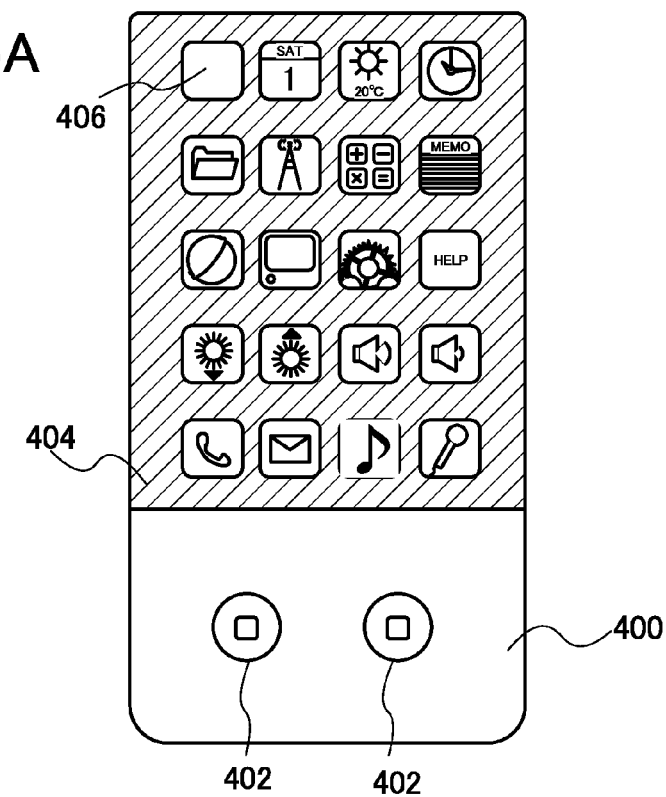
FIGS. 15A and 15B illustrate an electronic device.
Figure 15B:
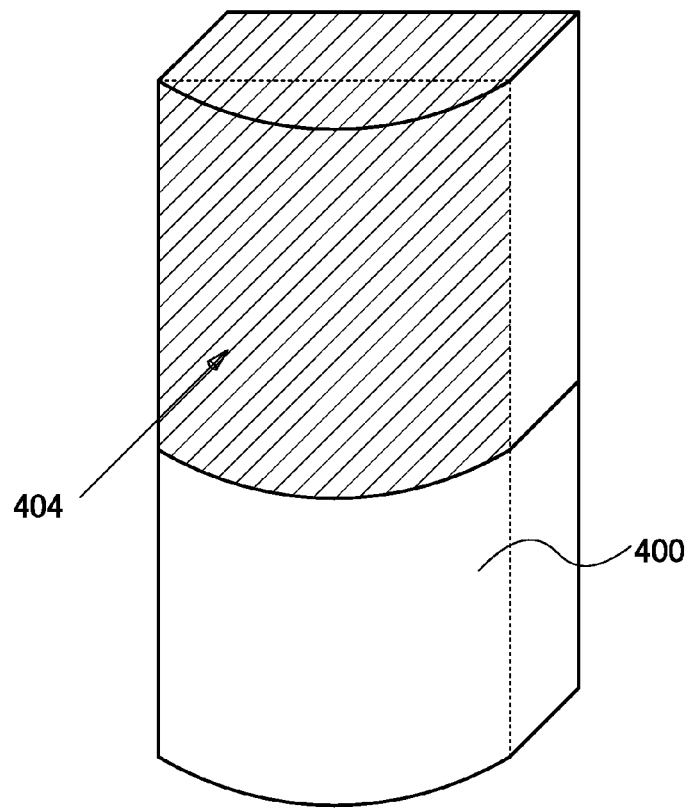

FIG. 15A is a schematic top view of the mobile phone when it is seen from the front, and FIG. 15B is a perspective view of the mobile phone.

The mobile phone shown in FIGS. 15A and 15B has a housing 400, a display portion 404 incorporated into the housing 400, and operation buttons 402.

Further, the light-emitting device described in Embodiment 5 is incorporated into the display portion 404. In this embodiment, a combination of the light-emitting device and a touch panel which are separately formed is the display portion 404. Thus, operation portions 406 are formed over the display portion 404.

In the mobile phone of this embodiment, as shown in FIG. 15B, the display portion 404 is curved with a specific curvature radius. Further, a region in a top portion of the housing 400 is also included in the display portion 404; thus, the display portion 404 of the mobile phone can be seen not only from the front but also from the top portion.

For example, on the top display region, incoming mails or calls, dates, phone numbers, personal names, and the like may be displayed. Accordingly, when the mobile phone is put in a breast pocket or the like, the display region can be seen without taking out the mobile phone from the breast pocket or the like.

The display device which is one embodiment of the present invention can be formed over a flexible substrate as described above and thus can be applied to a curved medium. Further, the light-emitting device formed over the flexible substrate is thin and lightweight; thus is preferably applied to a mobile phone and the like.

Embodiment 7 can be implemented in appropriate combination with the structures described in the other embodiments.

Next, an example of the lighting device including the light-emitting device described in the above embodiment and an example of a tablet terminal including the display device described in the above embodiment are described.

Figure 16A:
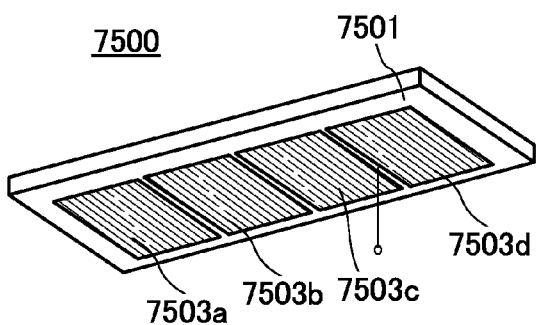
FIGS. 16A to 16D illustrate an electronic device.

FIG. 16A illustrates an example of the lighting device. In a lighting device 7500, light-emitting devices 7503a to 7503d which are one embodiment of the present invention are incorporated in a housing 7501 as light sources. Since the light-emitting device which is one embodiment of the present invention is thin, lightweight, and flexible, the lighting device 7500 can be attached to a ceiling, a wall, or the like.

Further, since the light-emitting device which is one embodiment of the present invention has high impact resistance and reliability, a lighting device which is thin and lightweight and has high flexibility, impact resistance, and reliability can be provided.

Further, the light-emitting device includes a light-emitting panel which emits light having high brightness and a pale color and causing less eyestrain even in the case of long-time use, light of a bright red color, and light of a bright color different from the other colors. By adjusting conditions under which the light-emitting element is driven for each emission color, a lighting device whose hue can be adjusted by a user can be achieved.

Figure 16B:
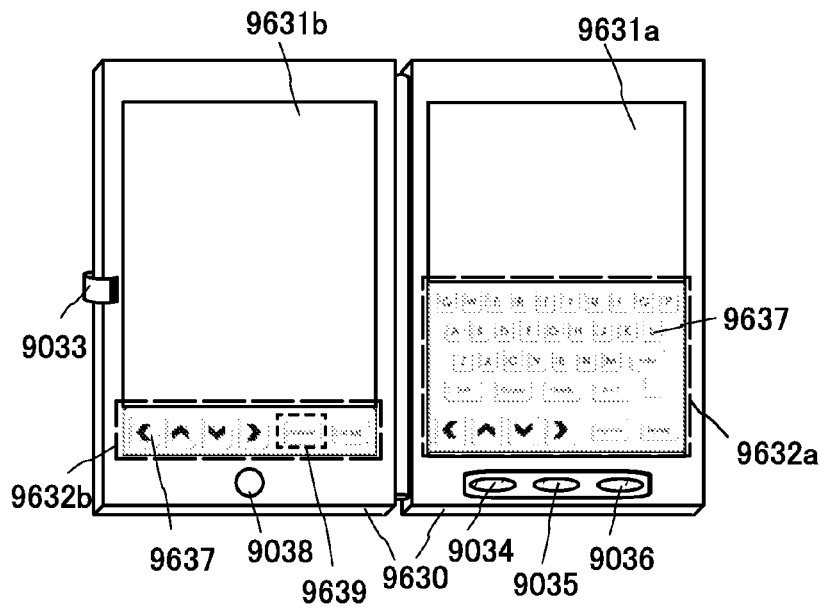
Figure 16C:
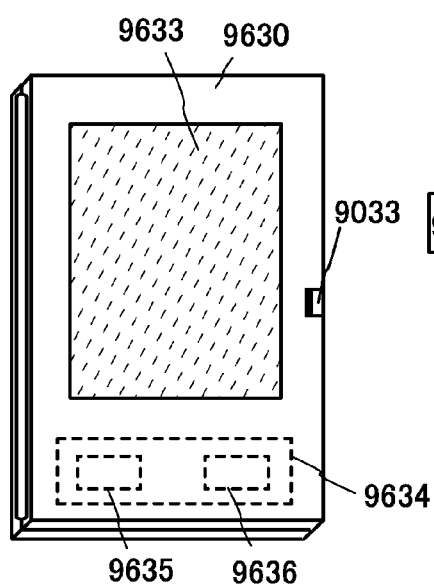

FIGS. 16B and 16C illustrate the tablet terminal that can be folded. In FIG. 16B, the tablet terminal is opened, and includes a housing 9630, a display portion 9631a, a display portion 9631b, a switch 9034 for switching display modes, a power switch 9035, a switch 9036 for switching to power-saving mode, a fastener 9033, and an operation switch 9038. Note that in the tablet terminal, one or both of the display portion 9631a and the display portion 9631b is/are formed using the display device described in the embodiment. Thus, the tablet terminal described in this embodiment is thin and lightweight and has high flexibility, impact resistance, and hermeticity.

A touch panel area 9632a can be provided in a part of the display portion 9631a, in which area, data can be input by touching displayed operation keys 9637. Although half of the display portion 9631a has only a display function and the other half has a touchscreen function, one embodiment of the present invention is not limited to the structure. The whole display portion 9631a may have a touchscreen function. For example, all the area of the display portion 9631a can display keyboard buttons and serve as a touch panel while the display portion 9631b can be used as a display screen.

Like the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The display-mode switching button 9034 allows switching between a landscape mode and a portrait mode, color display and black-and-white display, and the like. With the switch 9036 for switching to power-saving mode, the luminance of display can be optimized in accordance with the amount of external light at the time when the tablet is in use, which is detected with an optical sensor incorporated in the tablet. The tablet may include another detection device such as a sensor for detecting orientation (e.g., a gyroscope or an acceleration sensor) in addition to the optical sensor.

Although the display portion 9631a and the display portion 9631b have the same display area in FIG. 16B, one embodiment of the present invention is not limited to this example. The display portion 9631a and the display portion 9631b may have different areas or different display quality. For example, one of them may be a display panel that can display higher-definition images than the other.

The tablet terminal is closed in FIG. 16C. The tablet terminal includes the housing 9630, a solar cell 9633, a charge/discharge control circuit 9634, a battery 9635, and a DCDC converter 9636. Note that in FIG. 16B, an example in which the charge and discharge control circuit 9634 includes the battery 9635 and the DCDC converter 9636 is illustrated.

Since the tablet can be folded in two, the housing 9630 can be closed when the tablet is not in use. Thus, the display portions 9631a and 9631b can be protected, thereby providing a tablet with high endurance and high reliability for long-term use.

In addition, the tablet terminal illustrated in FIGS. 16B and 16C can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar battery 9633, which is attached on the surface of the tablet terminal, supplies electric power to a touch panel, a display portion, an image signal processor, and the like. Provision of the solar battery 9633 is preferable in that the battery 9635 can be charged efficiently for one or two surfaces of the housing 9630. When a lithium ion battery is used as the battery 9635, there is an advantage of downsizing or the like.

The structure and operation of the charge and discharge control circuit 9634 illustrated in FIG. 16C are described with reference to a block diagram of FIG. 16D.

Figure 16D:
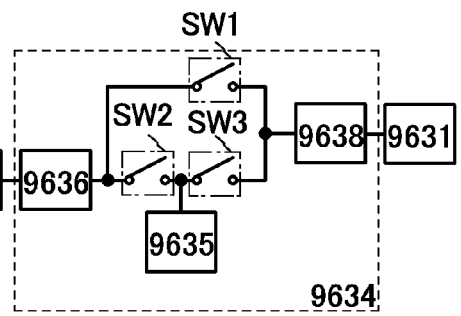

FIG. 16D illustrates the solar battery 9633, the battery 9635, the DCDC converter 9636, a converter 9638, switches SW1 to SW3, and the display portion 9631. The battery 9635, the DCDC converter 9636, the converter 9638, and the switches SW1 to SW3 correspond to the charge and discharge control circuit 9634 in FIG. 16C.

First, an example of operation in the case where power is generated by the solar battery 9633 using external light is described. The voltage of power generated by the solar battery 9633 is raised or lowered by the DCDC converter 9636 so that a voltage for charging the battery 9635 is obtained. When the power from the solar battery 9633 is used for the operation of the display portion 9631, the switch SW1 is turned on and the voltage of the power is raised or lowered by the converter 9638 to a voltage needed for operating the display portion 9631. In addition, when display on the display portion 9631 is not performed, the switch SW1 is turned off and a switch SW2 is turned on so that charge of the battery 9635 may be performed.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

One embodiment of the present invention is not particularly limited to the electronic device illustrated in FIGS. 15A and 15B and FIGS. 16A to 16D as long as the light-emitting device described in the above embodiment is included.

As described above, when the light-emitting device which is one embodiment of the present invention is used, an electronic device and a lighting device which are thin and lightweight and has high flexibility, impact resistance, and reliability can be provided.

This embodiment can be combined with any of the other embodiments disclosed in this specification as appropriate.

This application is based on Japanese Patent Application serial No. 2012-109603 filed with Japan Patent Office on May 11, 2012, the entire contents of which are hereby incorporated by reference.

What is claimed is:

1. A light-emitting device comprising:
a first flexible substrate comprising a light-emitting region;
a second flexible substrate facing the first flexible substrate, the second flexible substrate comprising an opening around the light-emitting region; and
frit glass sealing the first flexible substrate and the second flexible substrate,
wherein the opening is filled with the frit glass.

2. The light-emitting device according to claim 1, wherein the opening is a dot shape or a slit shape.

3. The light-emitting device according to claim 1, wherein at least one of the first flexible substrate and the second flexible substrate is a metal base.

4. A light-emitting device comprising:
a first flexible substrate comprising a light-emitting region;
a second flexible substrate facing the first flexible substrate, the second flexible substrate comprising a first opening overlapping with the light-emitting region and a second opening around the light-emitting region; and
frit glass sealing the first flexible substrate and the second flexible substrate,
wherein the second opening is filled with the frit glass.

5. The light-emitting device according to claim 4, wherein the second opening is a dot shape or a slit shape.

6. The light-emitting device according to claim 4, wherein at least one of the first flexible substrate and the second flexible substrate is a metal base.

7. The light-emitting device according to claim 4, further comprising a coloring layer overlapping with the light-emitting region.

\* \* \* \* \*